(12) United States Patent
Chang et al.

(10) Patent No.: US 12,243,618 B2
(45) Date of Patent: Mar. 4, 2025

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Meng-Sheng Chang, Hsinchu County (TW); Yao-Jen Yang, Hsinchu County (TW); Yih Wang, Hsinchu (TW); Fu-An Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/164,274

(22) Filed: Feb. 3, 2023

(65) Prior Publication Data

US 2023/0189512 A1 Jun. 15, 2023

Related U.S. Application Data

(63) Continuation of application No. 16/713,967, filed on Dec. 13, 2019, now Pat. No. 11,600,626.

(51) Int. Cl.
*G11C 7/10* (2006.01)
*G11C 5/06* (2006.01)
(Continued)

(52) U.S. Cl.
CPC ............ *G11C 7/1096* (2013.01); *G11C 5/063* (2013.01); *G11C 7/1069* (2013.01); *G11C 8/08* (2013.01); *G11C 17/165* (2013.01); *G11C 17/18* (2013.01); *H01L 23/5226* (2013.01); *H01L 23/5252* (2013.01); *H10B 20/25* (2023.02)

(58) Field of Classification Search
CPC . H01L 23/5226; H01L 23/5252; H10B 20/25; G11C 5/063; G11C 7/1069; G11C 7/1096; G11C 8/08; G11C 17/165; G11C 17/18; G11C 17/16
See application file for complete search history.

(56) References Cited

U.S. PATENT DOCUMENTS 10,403,380 B2 9/2019 Takaoka
2015/0123209 A1 5/2015 Choi et al.
(Continued)

FOREIGN PATENT DOCUMENTS

CN 106067459 A 11/2016
CN 110147564 A 8/2019
(Continued)

*Primary Examiner* — Galina G Yushina
(74) *Attorney, Agent, or Firm* — Maschoff Brennan

(57) ABSTRACT

A method includes: coupling a first gate to a first word line through a first gate via, wherein the first gate extends along a first direction; coupling the first gate to a second word line through a second gate via, wherein each of the first gate, a second gate, the first gate via and the second gate via is disposed on a first active area which extends along the second direction, wherein the second gate extends along the first direction and is separated from the first gate along a second direction; coupling the first active area to a first bit line through a first conductive via; and aligning the first gate via, the second gate via and the a first conductive via with each other along the second direction.

20 Claims, 15 Drawing Sheets

(51) Int. Cl.
  *G11C 8/08* (2006.01)
  *G11C 17/16* (2006.01)
  *G11C 17/18* (2006.01)
  *H01L 23/522* (2006.01)
  *H01L 23/525* (2006.01)
  *H10B 20/25* (2023.01)

(56) References Cited

U.S. PATENT DOCUMENTS

| | | |
|---|---|---|
| 2015/0206595 A1 | 7/2015 | Jeong |
| 2015/0380102 A1 | 12/2015 | Choi et al. |
| 2016/0141049 A1* | 5/2016 | Song ............... H01L 23/5252 |
| | | 365/51 |
| 2016/0148705 A1 | 5/2016 | Lee et al. |
| 2016/0300843 A1 | 10/2016 | Jung |
| 2017/0154686 A1* | 6/2017 | Liaw ............... H01L 29/7851 |
| 2017/0243660 A1 | 8/2017 | Kim et al. |
| 2017/0278855 A1 | 9/2017 | Liaw et al. |
| 2018/0033795 A1* | 2/2018 | Horch ............... H10B 20/25 |
| 2019/0251223 A1* | 8/2019 | Chang ............... G11C 17/18 |
| 2019/0267389 A1* | 8/2019 | Choi ............... H01L 29/51 |

FOREIGN PATENT DOCUMENTS

| | | |
|---|---|---|
| KR | 20160001152 A | 1/2016 |
| KR | 20190098078 A | 8/2019 |
| TW | 201719669 A | 6/2017 |
| TW | 201941089 A | 10/2019 |

\* cited by examiner

1200B

METHOD OF MANUFACTURING SEMICONDUCTOR DEVICE

CROSS-REFERENCE TO RELATED APPLICATION(S)

This application is a continuation application of U.S. application Ser. No. 16/713,967, filed on Dec. 13, 2019, which is herein incorporated by reference.

BACKGROUND

A non-volatile memory is able to retain data after the supply power is interrupted. Generally, the non-volatile memory is programmed to record data therein. There are various types of the non-volatile memory, including, for example, a multi-time programming memory (also referred to as MTP memory), a one-time programming memory (also referred to as OTP memory), and so on. Depending on characteristics, the one-time programming memory is also referred to as an anti-fuse memory. Before a memory cell in the one-time programming memory is programmed, the memory cell may have a high resistance storage state, and after the memory cell is programmed, the memory cell may have a low resistance storage state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
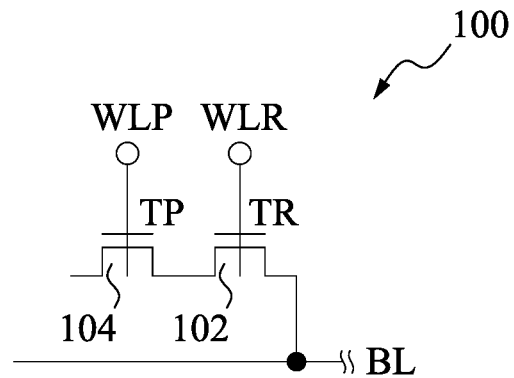
FIG. 1 is a schematic diagram of an anti-fuse memory cell, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

An anti-fuse memory device and cell structures therein are provided in accordance with various embodiments. Some variations of some embodiments are discussed. Throughout various views and illustrative embodiments, like elements are designated with the like reference numbers for ease of understanding.

Reference is now made to FIG. 1. FIG. 1 is a schematic diagram of an anti-fuse memory cell 100, in accordance with some embodiments of the present disclosure. In some embodiments, the anti-fuse memory cell 100 is also referred to as a one-time programming (OTP) memory cell. For illustration in FIG. 1, the anti-fuse memory cell 100 includes a reading device 102 and a programming device 104. The programming device 104 is coupled to the reading device 102, and a terminal of the reading device 102 is coupled to a bit line BL to receive data signal from the bit line BL.

In some embodiments, the reading device 102 and the programming device 104 are implemented with Metal-Oxide-Semiconductor (MOS) transistors. In some embodiments, the reading device 102 and the programming device 104 are implemented with N type MOS (NMOS) transistors. For illustration of FIG. 1, the reading device 102 and the programming device 104 are implemented with MOS transistors TR and TP, respectively. A first source/drain terminal of the transistor TR is coupled to the bit line BL, and a gate terminal of the transistor TR is coupled to a read word line that is designated with WLR. A first source/drain terminal of the transistor TP is coupled to a second source/drain terminal of the transistor TR, and a gate terminal of the transistor TP is coupled to a program word line that is designated with WLP. A second source/drain terminal of the transistor TP is coupled to a voltage line (not shown).

The reference designation WLR in the present disclosure denotes a general read word line throughout the description. The reference designation WLP in the present disclosure denotes a general program word line throughout the description. The reference designations of the features throughout the description may be referred to using the reference designations WLR and WLP followed by a number. For example, when features are denoted as WLR0 and WLR1, they indicate two different read word lines, and when features are denoted as WLP0 and WLP1, they indicate two different program word lines. In some embodiments, the read word line WLR is also referred to as "selection word line," "word line gate line," and so on. In some embodiments, the program word line WLP is also referred to as "program gate line," "anti-fuse gate line," "anti-fuse control line," and so on. Moreover, the reference designation BL in the present disclosure denotes a general bit line throughout the description.

Similarly, the reference designations TR and TP in the present disclosure denote transistors that are coupled to the read word line WLR and the program word line WLP, respectively, throughout the description. Accordingly, in some embodiments, the transistor TR is also referred to as "selection transistor," and the transistor TP is also referred to as "program transistor."

For illustration of operation, for programming the anti-fuse memory cell 100, a ground voltage (0V) is provided to the voltage line and the bit line BL, a selecting voltage Vdd is provided to the read word line WLR, and a programming voltage Vp is provided to the program word line WLP. In some embodiments, the magnitude of the programming voltage Vp is larger than that of the selecting voltage Vdd. For example, the magnitude of the programming voltage Vp ranges from about 3.6V to about 6V, and the selecting voltage Vdd ranges from about 1.5V to about 2.2V. In some other embodiments, the magnitude of the voltage on the bit line BL ranges from about 0V to about 0.5V.

When the transistor TR is turned on in response to the selecting voltage Vdd applied to the read word line WLR and the ground voltage is applied to the bit line BL, the programming voltage Vp that is high enough is applied to the gate of the transistor TP. Because the programming voltage Vp is beyond a withstanding voltage range of the gate, the gate of the transistor TP is ruptured. The ruptured gate is considered as a resistor with a low resistance value, for illustration. The anti-fuse memory cell 100 accordingly generates a program current flowing to the bit line BL through the turn-on transistor TR.

During a read operation, the ground voltage (0V) is provided to the bit line BL and the voltage line, the selecting voltage Vdd is provided to the read word line WLR, and a read voltage Vr is provided to the program word line WLP. When the transistor TR is turned on in response to the reading voltage Vdd, the transistor TP generates a read current in response to the read voltage Vr. The anti-fuse memory cell 100 accordingly generates the read current flowing through the transistor TR to the bit line BL. According to the magnitude of the read current flowing through the bit line BL, the anti-fuse memory cell 100 is configured to have a storing state in some embodiments. In some embodiments, the magnitude of the selecting voltage Vdd is the same as that of the read voltage Vr. For example, the magnitude of the read voltage Vr ranges from about 1V to about 2V, and the selecting voltage Vdd ranges from about 0.75V to about 1.5V. In some other embodiments, the magnitude of the voltage on the bit line BL ranges from about 0V to about 0.5V.

The above implementations of the reading device 102 and the programming device 104 are given for illustrative purposes. Various implementations of the reading device 102 and the programming device 104 are within the contemplated scope of the present disclosure. For example, depending on various manufacturing processes, the reading device 102 and the programming device 104 are implemented with various types of MOS transistors, including, for example, Fin Field Effect Transistors (FinFETs), in various embodiments. For another example, in various embodiments, the reading device 102 and the programming device 104 as discussed above are implemented with a single transistor. For illustration, the transistors TP and TR as discussed above are manufactured as a single transistor to perform the same functions of the transistors TP and TR.

The configuration of the anti-fuse memory cell 100 as illustrated above is also given for illustrative purposes. Various configurations of the anti-fuse memory cell 100 are within the contemplated scope of the present disclosure. For example, in various embodiments, the second source/drain terminal of the transistor TP as the programming device 104 is not coupled to the voltage line and is electrically floating (unconnected). The transistor TP having the second source/drain terminal being electrically floating is applicable in all of the embodiments as discussed in the present disclosure.

Figure 2:
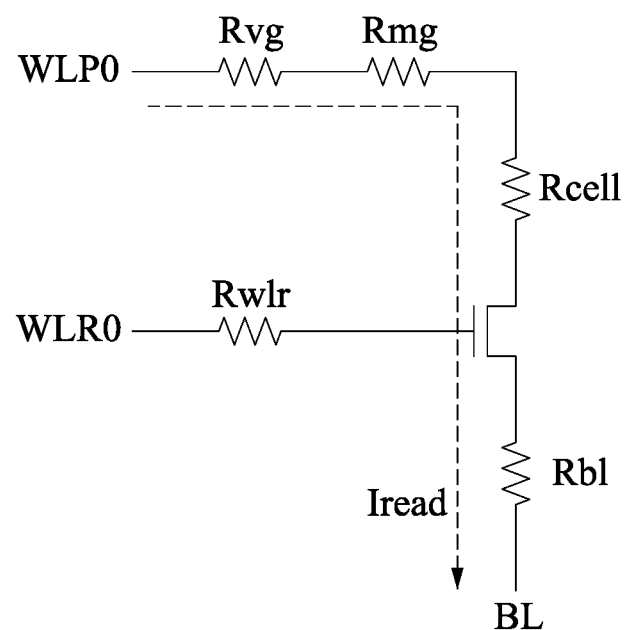
FIG. 2 is an equivalent circuit of the anti-fuse memory cell shown in FIG. 1, in accordance with some embodiments of the present disclosure.

Reference is now made to FIG. 2. FIG. 2 is an equivalent circuit 200 of the anti-fuse memory cell 100 shown in FIG. 1, in accordance with some embodiments of the present disclosure. The equivalent circuit 200 of the anti-fuse memory cell 100 is illustrated with resistors and the transistor TR to show the effective circuit connections. For illustration in FIG. 2, the equivalent circuit 200 includes a resistor Rvg, a resistor Rmg, a resistor Rcell, a resistor Rwlr, the transistor TR, and a resistor Rbl.

For illustration in FIG. 2, the resistor Rvg couples the program word line WLP to the resistor Rmg, the resistor Rwlr couples the read word line WLR to the transistor TR, the resistor Rcell is coupled between the resistor Rmg and the transistor TR, and the resistor Rbl couples the transistor TR to the bit line BL.

The resistor Rvg indicates the resistance between the program word line WLP and the gate terminal of the transistor TP, and the resistor Rwlr indicates the resistance between the read word line WLR and the gate terminal of the transistor TR. The resistor Rbl indicates the resistance between the first source/drain terminal of the transistor TR and the bit line BL.

The resistor Rmg indicates the resistance of the gate structure corresponding to the gate terminal of the transistor TP. For example, when a current or a signal is transmitted through the gate structure, the resistor Rmg indicates the resistance which the current or the signal experienced. In some embodiments, compared to other resistors shown in FIG. 2, the resistor Rmg is relatively small because a distance of path through which the current or the signal traveled in the gate structure is very short. Thus, the resistor Rmg is omitted in some embodiments.

In some embodiments, after the anti-fuse memory cell 100 is programmed, the gate of the transistor TP is ruptured, and thus an electrical path between the gate terminal of the transistor TP and the first source/drain terminal of the transistor TP is effectively viewed as the resistor Rcell as illustrated in FIG. 2. In some embodiments, a resistance of the resistor Rcell is about several kilo-ohms.

In some embodiments, the anti-fuse memory cell 100 is formed with several layers. For example, the sources/drains of the transistors TP and TR are arranged in a layer of active area, the gates of the transistors TP and TR are arranged in a layer of gate structure above the layer of active area, and the word lines WLP and WLR and the bit line BL are arranged in a layer above the layer of gate structure. Accordingly, the resistor Rbl also indicates the resistance of the electrical connection between the layer of the active area and the layer of bit line BL in some embodiments. Moreover, in some embodiments, vias are applied in the electrical connections between the layers. Accordingly, the resistors Rvg, Rwlr, and Rbl indicate effective resistances of the vias connected between the layers, in some embodiments.

In some embodiments, during the read operation, a current path is provided for the read current from the program word line WLP to the bit line BL. For illustration in FIG. 2, the current path is illustrated along the current flow, and the current is designated as Iread.

The above implementation of the equivalent circuit 200 is provided for illustrative purposes. Various implementations of the equivalent circuit 200 are within the contemplated scope of the present disclosure. For example, the equivalent circuit 200 includes more or less resistors indicating other connections in the anti-fuse memory cell 100.

Figure 3:
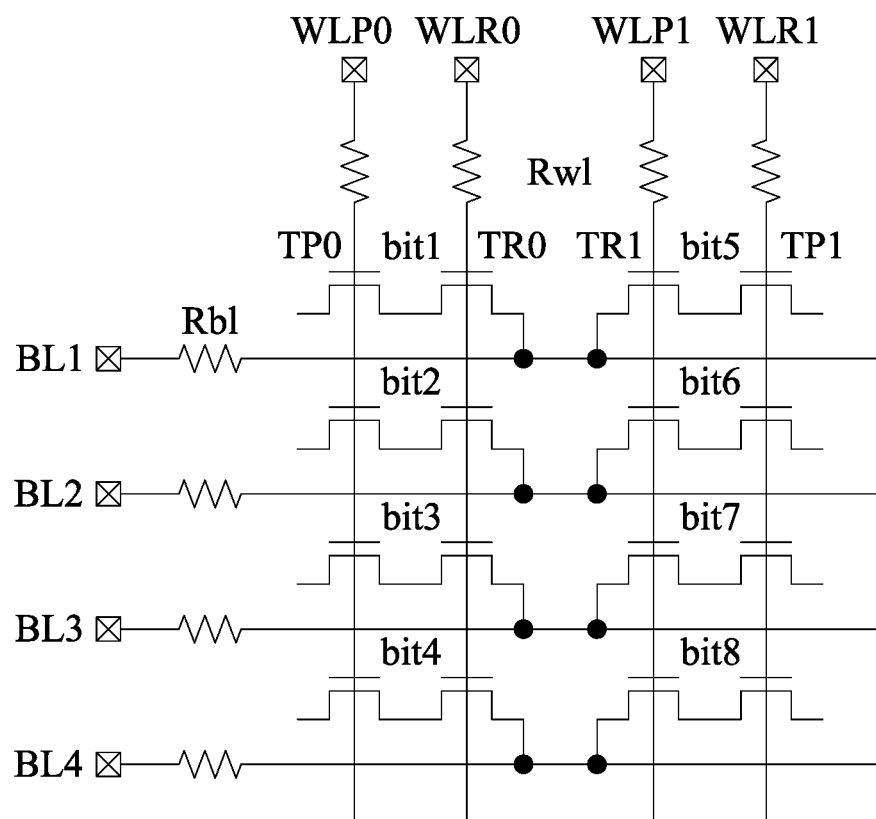
FIG. 3 is a circuit schematic diagram of an anti-fuse memory cell array, in accordance with some embodiments of the present disclosure.

Reference is made to FIG. 3. FIG. 3 is a circuit schematic diagram of an anti-fuse memory cell array 300, in accordance with some embodiments of the present disclosure. For illustration in FIG. 3, the anti-fuse memory cell array 300 includes eight anti-fuse memory cells which are designated as bit1, bit2, bit3, bit4, bit5, bit6, bit7, and bit8, each of which corresponds to the anti-fuse memory cells 100 of FIG. 1. The bit1, bit2, bit3, and bit4 are arranged in a column connected to the program word line WLP0 and read word line WLR0, and the bit5, bit6, bit7, and bit8 are arranged in a column connected to the program word line WLP1 and read word line WLR1. The bit1 and bit5 are arranged in a row connected to the bit line BL1, the bit2 and bit6 are arranged in a row connected to the bit line BL2, the bit3 and bit7 are arranged in a row connected to the bit line BL3, and the bit4 and bit8 are arranged in a row connected to the bit line BL4.

FIG. 3 further illustrates Rwl connected to the program word lines WLP0 and WLP1 and the read word lines WLR0 and WLR1, and resistors Rbl connected to the bit lines BL1-BL4. The resistors Rwl and Rbl indicate the effective resistances of electrical connections of the program word lines WLP0 and WLP1, the read word lines WLR0 and WLR1, and the bit lines BL1-BL4 to the anti-fuse memory cells bit1-bit8. In some embodiments, each one of the resistors Rwl is a combination of the resistor Rvg and the resistor Rmg shown in FIG. 2.

During the program operation, similar to the program operation described in FIG. 1, the ground voltage is provided to the voltage line (not shown) and the bit lines BL1-BL4, the selecting voltage Vdd is provided to the read word lines WLR0 and WLR1, and programming voltages Vp and Vp' are provided to the program word lines WLP0 and WLP1, respectively. In some embodiments, the magnitude of each one of the programming voltages Vp and Vp' is larger than that of the selecting voltage Vdd.

During the read operation, similar to the read operation described in FIG. 1, the ground voltage is provided to the bit lines BL1-BL4 and the voltage line (not shown), the selecting voltage Vdd is provided to the read word line WLR0, and a read voltage Vr is provided to the program word line WLP0. The anti-fuse memory cells bit1-bit4 accordingly generates the read current flowing through the anti-fuse memory cells bit1-bit4 to the bit lines BL1-BL4, respectively. According to the magnitude of the read current flowing to the bit lines BL1-BL4, the anti-fuse memory cells bit1-bit4 are configured to have storing states in some embodiments.

Similar to the anti-fuse memory cells bit1-bit4, during the read operation, the ground voltage is provided to the bit lines BL1-BL4 and the voltage line (not shown), the selecting voltage Vdd is provided to the read word line WLR1, and a read voltage Vr is provided to the program word line WLP1. The anti-fuse memory cells bit5-bit8 accordingly generates the read current flowing through the anti-fuse memory cells bit5-bit8 to the bit lines BL1-BL4, respectively. According to the magnitude of the read current flowing to the bit lines BL1-BL4, the anti-fuse memory cells bit5-bit8 are configured to have storing states in some embodiments. In some embodiments, the read operation of the anti-fuse memory cells bit1-bit4 and the read operation of the anti-fuse memory cells bit5-bit8 are not performed at the same time, to avoid signal interference.

Figure 4:
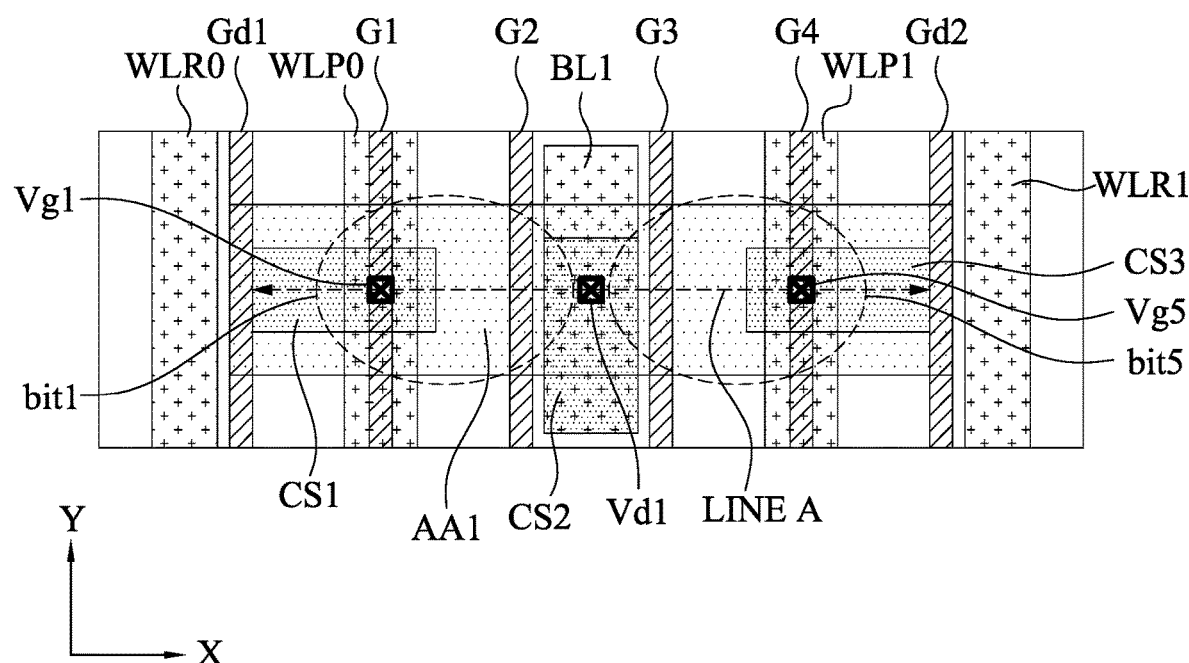
FIG. 4 is a layout structure of part of the anti-fuse memory cell array shown in FIG. 3, in accordance with some embodiments of the present disclosure.

Reference is made to FIG. 4. FIG. 4 is a layout structure 400 of part of the anti-fuse memory cell array 300 shown in FIG. 3, in accordance with some embodiments of the present disclosure. In some embodiments, the layout structure 400 corresponds to the anti-fuse memory cells bit1 and bit5 shown in FIG. 3. Alternatively stated, the layout structure 400 illustrates a row of the anti-fuse memory cell array 300. In some embodiments, at least one of the other rows in the anti-fuse memory cell array 300 is implemented with the same layout as the layout structure 400.

Figure 5:
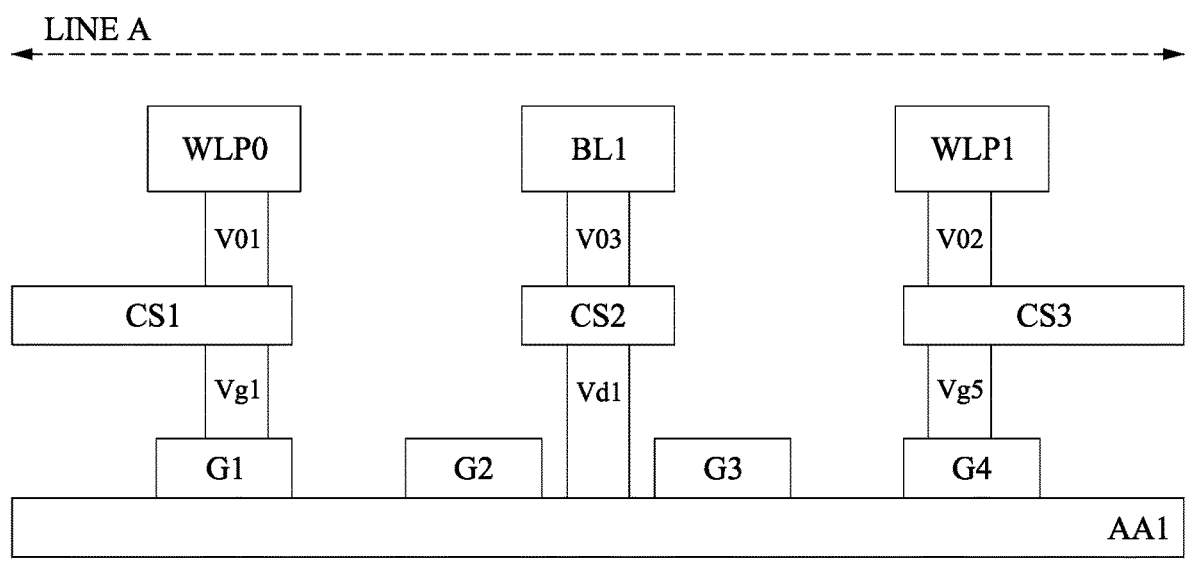
FIG. 5 is a schematic diagram illustrating a cross-section view, along a LINE A, of the anti-fuse memory cells shown in FIG. 4, in accordance with some embodiments of the present disclosure.

FIG. 5 is a schematic diagram 500 illustrating a cross-section view, along a LINE A, of the anti-fuse memory cells bit1 and bit5 shown in FIG. 4, in accordance with some embodiments of the present disclosure. For ease of understanding, the embodiments with respect to FIG. 4 are discussed with reference to FIG. 5.

For illustration in FIG. 4, the layout structure 400 includes an active area AA1, a gate G1, a gate G2, a gate G3, a gate G4, a gate Gd1, a gate Gd2, a conductive segment CS1, a conductive segment CS2, a conductive segment CS3, a program word line WLP0, a program word line WLP1, a read word line WLR0, a read word line WLR1, a bit line BL1, a gate via Vg1, a gate via Vg5, and a conductive via Vd1.

The gates G1-G4 are arranged above the active area AA1, and the gates G1-G4 extend to cross over the active area AA1. The gates G1-G4 are arranged to be separate from each other. The conductive segments CS1 and CS3 are arranged above the gate G1 and the gate G4, respectively. In some embodiments, the conductive segments CS1 and CS3 are disposed directly above the active area AA1. The program word lines WLP0 and WLP1 are arranged above the conductive segments CS1 and CS3, respectively. The read word lines WLR0 and WLR1 are arranged at two opposite sides of the active area AA1 in a layout view of the layout structure 400.

In some embodiments, the active area AA1 is implemented by a doped region/area, in order for the formation of the transistors included in the anti-fuse memory cells bit1 and bit5 as shown in FIG. 3. In some embodiments, the active area AA1 is configured for the source/drain of the transistors TP and transistors TR of the anti-fuse memory cells bit1 and bit5. The gate G1 corresponds to the gate of the transistor TP0 of the anti-fuse memory cell bit1, and the gate G2 corresponds to the gate of the transistor TR0 of the anti-fuse memory cell bit1. The gate G4 corresponds to the gate of the transistor TP1 of the anti-fuse memory cell bit5, and the gate G3 corresponds to the gate of the transistor TR1 of the anti-fuse memory cell bit5.

In some embodiments, the gate via Vg1 is disposed directly above the active area AA1, and couples the gate G1 to the conductive segment CS1. The conductive segment CS1 is coupled to the program word line WLP0 through a via V01 (shown in FIG. 5), and configured to receive the reading voltage Vr and/or programming voltage Vp. In some embodiments, the gate via Vg5 is disposed directly above the active area AA1, and couples the gate G4 to the conductive segment CS3. The conductive segment CS3 is coupled to the program word line WLP1 through a via V02 (shown in FIG. 5), and configured to receive the reading voltage Vr and/or programming voltage Vp.

In some embodiments, the vias V01 and V02 are disposed above and overlap the gate vias Vg1 and Vg5, respectively, in the layout view of the layout structure 400, as well as shown in FIG. 5. Accordingly, in FIG. 4, the layout structure 400 only illustrates the gate vias Vg1 and Vg5, for simplicity of illustration. However, the present disclosure is not limited to the embodiments of FIGS. 4 and 5. Various positions of the vias V01-V02 are within the contemplated scope of the present disclosure. For example, in various embodiments, the via V01 is disposed at a position where the via V01 is not overlapped with the active area AA1 in the layout view of the layout structure 400.

In some embodiments, the active area AA1 is coupled to the conductive segment CS2 through the conductive via Vd1, in which the conductive segment CS2 is disposed between the gate G2 and the gate G3 in the layout view of the layout structure 400, and the conductive via Vd1 is disposed directly above the active area AA1. In some embodiments, the conductive segment CS2 is arranged along a direction Y in which the gate G1 extends. For illustration, the conductive segment CS2 is coupled to the bit line BL1 through a via V03 (shown in FIG. 5), and is configured to receive data signals transmitted from the bit line BL1.

In some embodiments, the via V03 is disposed above and overlaps the conductive via Vd1 in the layout view of the layout structure 400, as well as shown in FIG. 5. Accordingly, in FIG. 4, the layout structure 400 only illustrates the conductive via Vd1, for simplicity of illustration. However, the present disclosure is not limited to the embodiments of FIGS. 4 and 5. Various positions of the via V03 are within the contemplated scope of the present disclosure. For example, in various embodiments, the via V03 is disposed above the conductive segment CS2 but is not overlapped with the active area AA1 in the layout view of the layout structure 400.

For illustration in FIG. 4, the gates Gd1 and Gd2 are arranged to be separate from the gates G1-G4, and the gates Gd1 and Gd2 are arranged at two opposite sides of the active area AA1 in the layout view of the layout structure 400. In some embodiments, the gates Gd1 and Gd2 are configured as dummy gates, in which a "dummy gate" does not act as the gate for MOS devices in some embodiments. The above configuration of the gates Gd1 and Gd2 is provided for illustrative purposes. Various configurations of the gates Gd1 and Gd2 are within the contemplated scope of the present disclosure. For example, in various embodiments, the gates Gd1 and Gd2 are omitted and not arranged in the layout structure 400.

In some approaches, a gate, corresponding to, for example, the gate of the transistor TP0 of FIG. 3, is coupled to, for example, the program word line WLP0 through a gate via, and the gate via is not disposed directly above an active area. Accordingly, when the program word line WLP0 and the active area have a current path therebetween associated with, for example, a reading operation, the current needs to flow from the program word line WLP0 through the gate via and a segment of the gate to the active area because the gate via is not disposed directly above the active area. With the current flowing through the segment of the gate, the current encounters a resistance (e.g., the resistance of the resistor Rmg in FIG. 2) corresponding to the segment of the gate. Alternatively stated, there is a relatively larger equivalent resistance on the current path. Accordingly, the performance of the operation (e.g., operation speed) associated with the current path is affected.

Compared to the above approaches, in the embodiments of the present disclosure, for example with reference to FIG. 4, the gate via Vg1 is disposed directly above the active area AA1 in the layout view of the layout structure 400. For illustration in FIG. 5, the program word line WLP0 is coupled to the gate G1 through the via V01, the conductive segment CS1, and the gate via Vg1. In such structures, the current on the current path substantially flows directly from the program word line WLP0 through the via V01, the conductive segment CS1, and the gate via Vg1 to the active area AA1. Accordingly, the current or signal transmitting through the gate G1 does not have to experience the resistance of the segment of the gate as discussed in the above approaches. Accordingly, the equivalent resistance on the current path between the program word line WLP0 and the active area AA1 is reduced. As a result, the performance of the operation (e.g., operation speed) associated with the current path is able to be improved.

In some approaches, a bit line corresponding to, for example, the bit line BL1 of FIG. 3, is coupled to, for example, the transistor TR0 through a via, and the via is not disposed directly above an active area. Similarly, when the bit line BL1 and the active area have a current path therebetween associated with, for example, a reading operation, the current needs to flow from the bit line BL1 through the via and an additional conductive segment to the active area because the via is not disposed directly above the active area. With the current flowing through the additional conductive segment, the current encounters a resistance (e.g., the resistance of the resistor Rbl in FIG. 2) corresponding to the additional conductive segment. Alternatively stated, there is a relatively larger equivalent resistance on the current path. Accordingly, the performance of the operation (e.g., operation speed) associated with the current path is affected.

Compared to the above approaches, in the embodiments of the present disclosure, for example with reference to FIGS. 4 and 5, the conductive via Vd1 and the via V03 are disposed directly above the active area AA1 in the layout view of the layout structure 400. For illustration in FIG. 5, the bit line BL1 is coupled to the active area AA1 through the via V03, the conductive segment CS2, and the conductive via Vd1. In such structures, the current on the current path substantially flows directly from the bit line BL1 through the via V03, the conductive segment CS2, and the conductive via Vd1 to the active area AA1. Accordingly, the current or signal transmitting from the bit line BL1 does not have to experience the resistance of the additional conductive segment as discussed in the above approaches. Accordingly, the equivalent resistance on the current path between the active area AA1 and the bit line BL1 is reduced. As a result, the performance of the operation (e.g., operation speed) associated with the current path is able to be improved.

Figure 6:
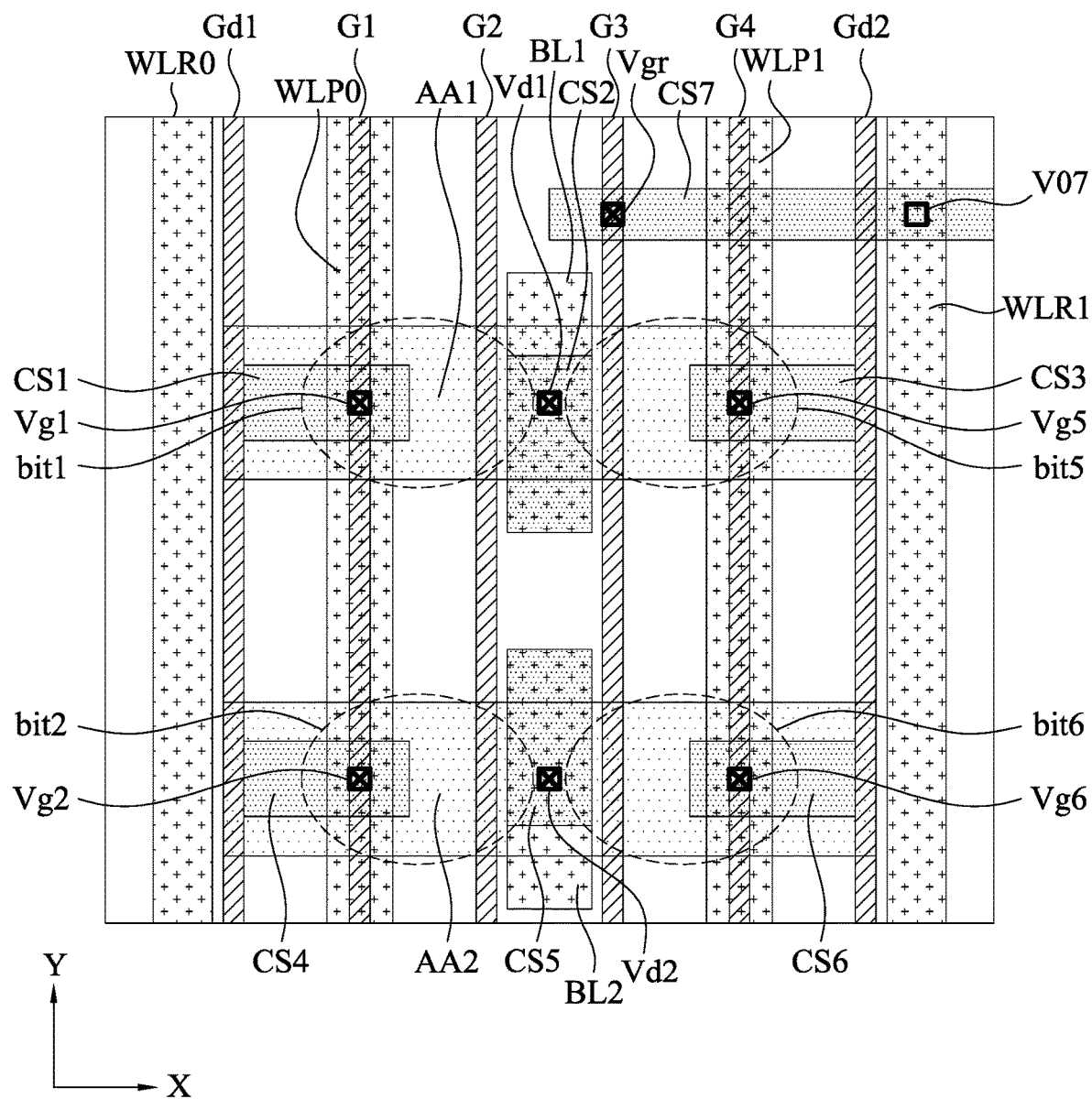
FIG. 6 is a layout structure of part of the anti-fuse memory cell array shown in FIG. 3, in accordance with some embodiments of the present disclosure.

Reference is made to FIG. 6. FIG. 6 is a layout structure 600 of part of the anti-fuse memory cell array 300 shown in FIG. 3, in accordance with some embodiments of the present disclosure. In some embodiments, the layout structure 600 corresponds to the anti-fuse memory cells bit1, bit2, bit5, and bit6 shown in FIG. 3. Alternatively stated, the layout structure 600 illustrates two rows in the anti-fuse memory cell array 300.

In some embodiments, structures of the anti-fuse memory cells bit1 and bit5 in the layout structure 600 are the same as those of the anti-fuse memory cells bit1 and bit5 in the layout structure 400 shown in FIG. 4. Accordingly, they are not further detailed herein.

Compared to the layout structure 400, the layout structure 600 further includes an active area AA2, a conductive segment CS4, a conductive segment CS5, a conductive segment CS6, a conductive segment CS7, a gate via Vg2, a gate via Vg6, a gate via Vgr, a conductive via Vd2, and a via V07.

For illustration in FIG. 6, the active area AA1 and the active area AA2 are separate from each other. In some embodiments, the active area AA2 is implemented by a doped region/area, in order for the formation of the transistors included in the anti-fuse memory cells bit2 and bit6 as shown in FIG. 3. For illustration, the active area AA2 is configured for the source/drain of the transistors TP and transistors TR of the anti-fuse memory cells bit2 and bit6.

The gates G1-G4 are arranged above the active area AA1 and the active area AA2, and the gates G1-G4 extend to cross over the active area AA1 and the active area AA2. Alternatively stated, the anti-fuse memory cells bit1 and bit2 share the same gate structures of the gates G1 and G2, and the anti-fuse memory cells bit5 and bit6 share the same gate structures of the gates G3 and G4. Accordingly, the anti-fuse memory cells bit1 and bit2 receive the same voltage, current, and/or signal from the program word line WLP0 and the read word line WLR0, and the anti-fuse memory cells bit5 and bit6 receive the same voltage, current, and/or signal from the program word line WLP1 and the read word line WLR1.

The conductive segments CS4 and CS6 are arranged above the gate G1 and the gate G4, respectively. In some embodiments, the conductive segments CS4 and CS6 are disposed directly above the active area AA2. The program word lines WLP0 and WLP1 are arranged above the conductive segments CS4 and CS6, respectively. The read word lines WLR0 and WLR1 are arranged at two opposite sides of the active area AA1 and the active area AA2 in the layout view of the layout structure 600.

In some embodiments, the gate via Vg2 is disposed directly above the active area AA2, and couples the gate G1 to the conductive segment CS4. The conductive segment CS4 is coupled to the program word line WLP0 through a via V04 (not shown, for simplicity of illustration) which is similar to the via V01 as illustrated in FIG. 5, and configured to receive the reading voltage Vr and/or programming voltage Vp as discussed above. In some embodiments, the gate via Vg6 is disposed directly above the active area AA2, and couples the gate G4 to the conductive segment CS6. The conductive segment CS6 is coupled to the program word line WLP1 through a via V05 (not shown, for simplicity of illustration) which is similar to the via V02 as illustrated in FIG. 5, and configured to receive the reading voltage Vr and/or programming voltage Vp' as discussed above.

In some embodiments, the vias V04 and V05, that are similar to the vias V01 and V02 as discussed above in FIG. 5, are disposed above and overlap the gate vias Vg2 and Vg6, respectively, in the layout view of the layout structure 600. Accordingly, in FIG. 6, the layout structure 600 only illustrates the gate vias Vg2 and Vg6, for simplicity of illustration. However, the present disclosure is not limited to the embodiments of FIG. 6. Various positions of the vias V04-V05 are within the contemplated scope of the present disclosure. For example, in various embodiments, the via V05 is disposed at a position where the via V05 is not overlapped with the active area AA2 in the layout view of the layout structure 600.

In some embodiments, the active area AA2 is coupled to the conductive segment CS5 through the conductive via Vd2, in which the conductive segment CS5 is disposed between the gate G2 and the gate G3 in the layout view of the layout structure 600, and the conductive via Vd2 is disposed directly above the active area AA2. In some embodiments, the conductive segment CS5 is arranged along the direction Y in which the gate G1 extends. For illustration, the conductive segment CS5 is coupled to the bit line BL2 through a via V06 (not shown, for simplicity of illustration) which is similar to the via V03 as illustrated in FIG. 5, and is configured to receive data signals transmitted from the bit line BL2.

In some embodiments, the via V06 is disposed above and overlaps the conductive via Vd2 in the layout view of the layout structure 600. Accordingly, in FIG. 6, the layout structure 600 only illustrates the conductive via Vd2, for simplicity of illustration. However, the present disclosure is not limited to the embodiments of FIG. 6. Various positions of the via V06 are within the contemplated scope of the present disclosure. For example, in various embodiments, the via V06 is disposed above the conductive segment CS5 but is not overlapped with the active area AA2 in the layout view of the layout structure 600.

For illustration in FIG. 6, the bit line BL2 is separate from the bit line BL1. The bit line BL1 and the bit line BL2 are arranged along the direction Y in which the gate G1 extends. The program word line WLP0 and program word line WLP1 are arranged along the direction Y in which the gate G1 extends. Alternatively stated, the program word line WLP0, the program word line WLP1, the bit line BL1, and the bit line BL2 are substantially arranged in parallel to each other.

Figure 9:
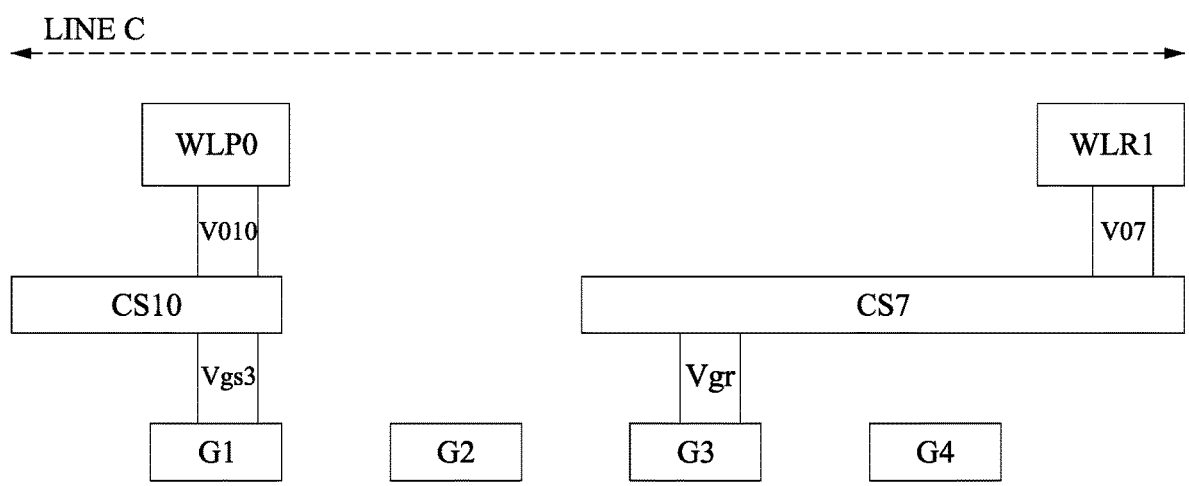
FIG. 9 is a schematic diagram illustrating a cross-section view, along a LINE C, of part of the layout structure shown in FIG. 7, in accordance with some embodiments of the present disclosure.

With reference to FIG. 6, the gate G3 is coupled to the conductive segment CS7 through a gate via Vgr (also shown in FIG. 9). The conductive segment CS7 is coupled to the read word line WLR1 through the via V07 (also shown in FIG. 9), and is configured to receive the selecting voltage Vdd as discussed above.

The above configuration of the layout structure 600 is provided for illustrative purposes. Various configurations of the layout structure 600 are within the contemplated scope of the present disclosure. For example, in various embodiments, the layout structure 600 includes additional conductive segments that are coupled to the gate G1 and/or G4, which will be discussed below with reference to FIG. 7.

Figure 7:
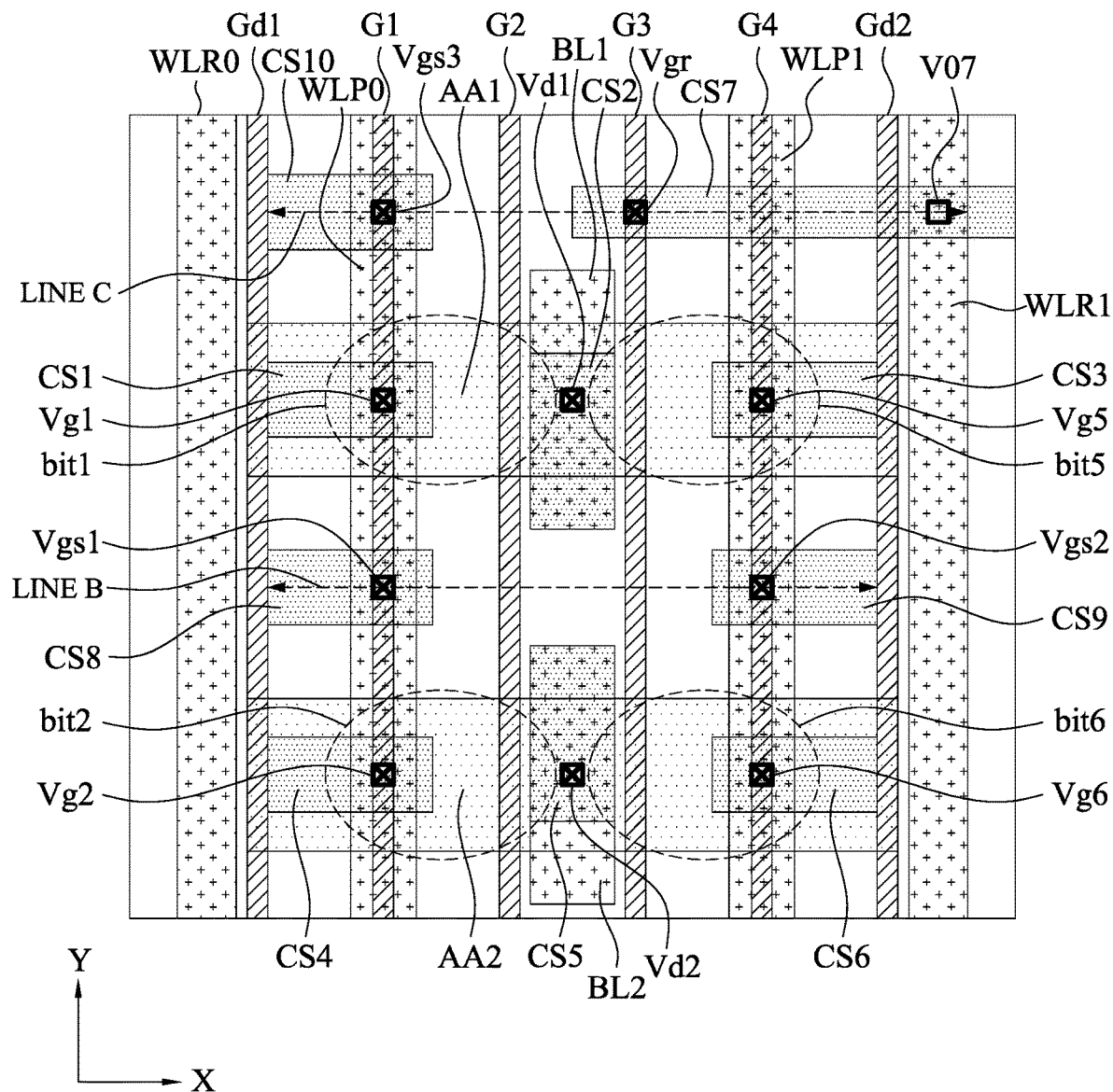
FIG. 7 is a layout structure of part of the anti-fuse memory cell array shown in FIG. 3, in accordance with various embodiments of the present disclosure.

FIG. 7 is a layout structure 700 of part of the anti-fuse memory cell array 300 shown in FIG. 3, in accordance with various embodiments of the present disclosure. In some embodiments, the layout structure 700 corresponds to the anti-fuse memory cells bit1, bit2, bit5, and bit6 shown in FIG. 3. With respect to the embodiments of FIG. 6, like elements in FIG. 7 are designated with the same reference numbers for ease of understanding. The specific configurations of similar elements, which are already discussed in detail in above paragraphs, are omitted herein for the sake of brevity.

Figure 8:
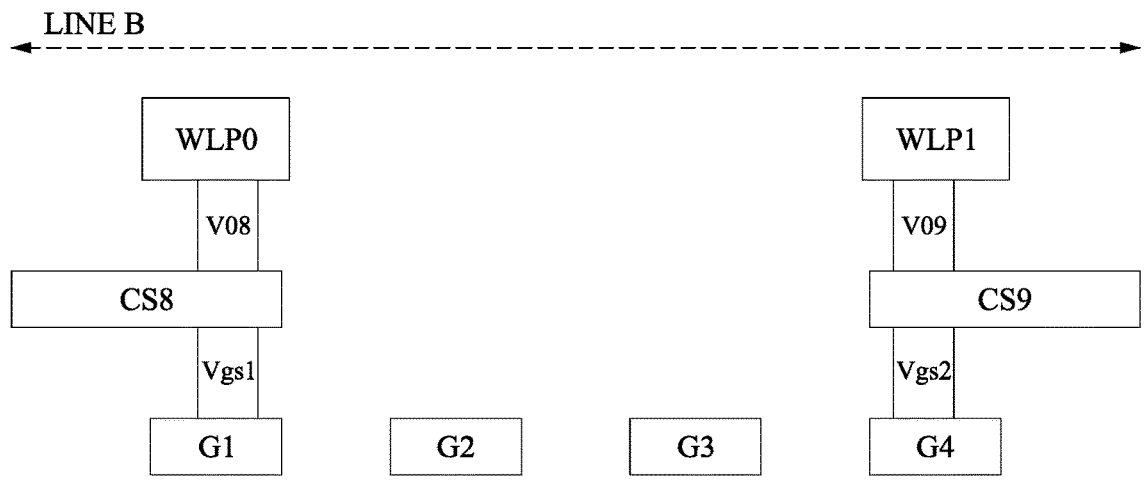
FIG. 8 is a schematic diagram illustrating a cross-section view, along a LINE B, of part of the layout structure shown in FIG. 7, in accordance with some embodiments of the present disclosure.

FIG. 8 is a schematic diagram 800 illustrating a cross-section view, along a LINE B, of part of the layout structure 700 shown in FIG. 7, in accordance with some embodiments of the present disclosure. FIG. 9 is a schematic diagram 900 illustrating a cross-section view, along a LINE C, of part of the layout structure 700 shown in FIG. 7, in accordance with some embodiments of the present disclosure. For ease of understanding, the embodiments with respect to FIG. 7 are discussed with reference to FIGS. 8 and 9.

Compared to the layout structure 600 of FIG. 6, the layout structure 700 of FIG. 7 further includes a conductive segment CS8, a conductive segment CS9, a conductive segment CS10, a gate via Vgs1, a gate via Vgs2, and a gate via Vgs3.

For illustration in FIG. 7, the conductive segment CS8 and the conductive segment CS9 are disposed between the active area AA1 and the active area AA2 in the layout view. The conductive segment CS8 is disposed between the anti-fuse memory cells bit1 and bit2 in the layout view, and the conductive segment CS9 is disposed between the anti-fuse memory cells bit5 and bit6 in the layout view. In other words, the conductive segments CS8 and CS9 are not overlapped with the active area AA1 and the active area AA2 in the layout view of the layout structure 700.

With reference to FIGS. 7 and 8, the conductive segment CS8 is coupled to the gate G1 through the gate via Vgs1, and the conductive segment CS8 is further coupled to the program word line WLP0 through a via V08. The conductive segment CS9 is coupled to the gate G4 through the gate via Vgs2, and the conductive segment CS9 is further coupled to the program word line WLP1 through a via V09.

In some embodiments, the vias V08 and V09 are disposed above and overlap the gate vias Vgs1 and Vgs2, respectively, in the layout view of the layout structure 700, as well as shown in FIG. 8. Accordingly, in FIG. 7, the layout structure 700 only illustrates the gate vias Vgs1 and Vgs2, for simplicity of illustration. However, the present disclosure is not limited to the embodiments of FIGS. 7 and 8. Various positions of the vias V08-V09 are within the contemplated scope of the present disclosure. For example, in various embodiments, the via V08 is disposed at a position where the via V08 is not overlapped with the gate G1 in the layout view of the layout structure 700.

In some embodiments, the resistance on the current path between the program word line WLP0 and the gate G1 is associated with the conductive segments and vias between the program word line WLP0 and the gate G1. Compared to the layout structure 600, the conductive segment CS8, the gate via Vgs1, and the via V08, as discussed above, provide an additional current path for current flowing from the program word line WLP0 to the gate G1. Accordingly, additional current is provided from the program word line WLP0 through the additional current path to the gate G1. Correspondingly, compared to the layout structure 600, the conductive segment CS9, the gate via Vgs2, and the via V09, as discussed above, also provide an additional current path for current flowing from the program word line WLP1 to the gate G4. Accordingly, still additional current is provided from the program word line WLP1 through the additional current path to the gate G4. With the additional current path associated with the conductive segment CS8 and/or CS9, more current is able to flow from the program word line WLP to the corresponding transistor TP, compared to those without the conductive segment CS8 and/or CS9. Accordingly, the operations of the above anti-fuse memory cells are able to be further improved, because of the more current.

For illustration in FIG. 7, the conductive segment CS10 is disposed separate from the active area AA1, and is not overlapped with the active area AA1 in the layout view of the layout structure 700. The conductive segment CS10 is opposite to the conductive segment CS8 with respect to the active area AA1.

With reference to FIGS. 7 and 9, the conductive segment CS10 is coupled to the gate G1 through the gate via Vgs3, and the conductive segment CS10 is further coupled to the program word line WLP0 through a via V010.

In some embodiments, the vias V010 is disposed above and overlap the gate via Vgs3 in the layout view of the layout structure 700, as well as shown in FIG. 9. Accordingly, in FIG. 7, the layout structure 700 only illustrates the gate via Vgs3, for simplicity of illustration. However, the present disclosure is not limited to the embodiments of FIGS. 7 and 9. Various positions of the via V010 are within the contemplated scope of the present disclosure. For example, in various embodiments, the via V010 is disposed at a position where the via V010 is not overlapped with the gate G1 in the layout view of the layout structure 700.

In addition to the current paths associated with the conductive segments CS8 and CS9 as discussed above, the conductive segment CS10, the gate via Vgs3, and the via V010 also contribute an additional current path for the current flowing from the program word line WLP0 to the gate G1. Accordingly, more current is able to flow from the program word line WLP0 to the corresponding transistor TP, compared to those with the conductive segments CS8 and CS9, but without the conductive segment CS10. Accordingly, the operations of the above anti-fuse memory cells are able to be further improved, because of the more current.

The above configuration of the layout structure 700 is provided for illustrative purposes. Various configurations of the layout structure 700 are within the contemplated scope of the present disclosure. For example, in various embodiments, the layout structure 700 includes additional conductive segments configured to provide additional current paths for the current or signal transmitting from the program word line WLP0 to the gate G1. For another example, in alternative embodiments, one or two of the conductive segments CS8-CS10 and the related structures are omitted.

Figure 10:
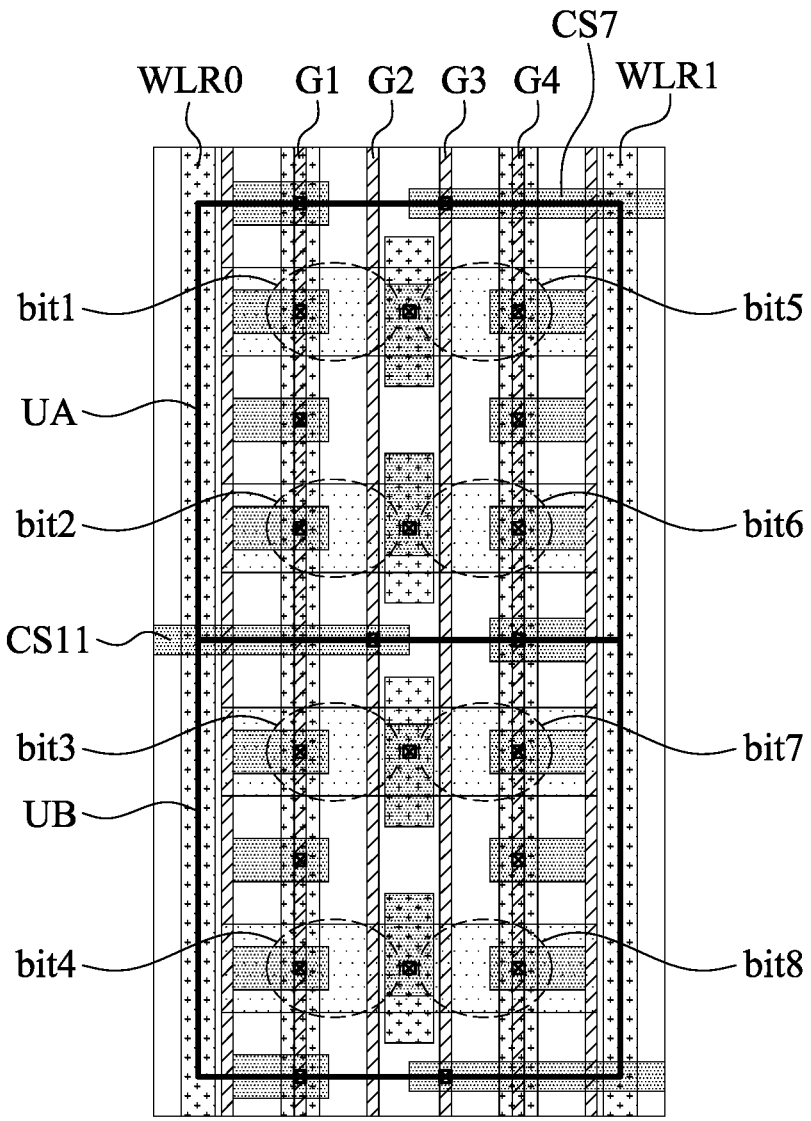
FIG. 10 is a layout structure of part of the anti-fuse memory cell array of FIG. 3, in accordance with alternative embodiments of the present disclosure.

Reference is made to FIG. 10. FIG. 10 is a layout structure 1000 of part of the anti-fuse memory cell array 300 of FIG. 3, in accordance with alternative embodiments of the present disclosure. For illustration in FIG. 10, the layout structure 1000 includes a unit UA and a unit UB. As illustrated in FIG. 10, the unit UA abuts the unit UB. The unit UA corresponds to the layout structure 700 of FIG. 7, and accordingly, the configurations of the unit UA correspond to those of the layout structure 700 of FIG. 7 as discussed above and thus are not further detailed herein. Moreover, the unit UB corresponds to a layout structure mirroring to the unit UA. With the layout structure mirroring to the unit UA, the configurations of the unit UB are not further detailed herein, for simplicity of illustration. Because the unit UA, mirroring to the unit UB, corresponds to the layout structure 700 of FIG. 7, for simplicity of illustration, some reference numbers in FIG. 7 are omitted in FIG. 10.

For illustration in FIG. 10, the unit UA includes the anti-fuse memory cells bit1, bit2, bit5, and bit 6, and the unit UB includes the anti-fuse memory cells bit3, bit4, bit7, and bit8. The anti-fuse memory cells bit1-bit4 share the gate G1 and the gate G2, and the anti-fuse memory cells bit5-bit8 share the gate G3 and the gate G4. In the unit UA, the conductive segment CS7 is coupled to the gate G3 and thus couples the anti-fuse memory cells bit5-bit6 to the read word line WLR1, as discussed above. For illustration in FIG. 10, the unit UB also includes a conductive segment CS11, which is arranged with respect to the conductive segment CS7. The conductive segment CS11 is coupled to the gate G2 and thus couples the anti-fuse memory cells bit3-bit4 to the read word line WLR0.

Figure 11:
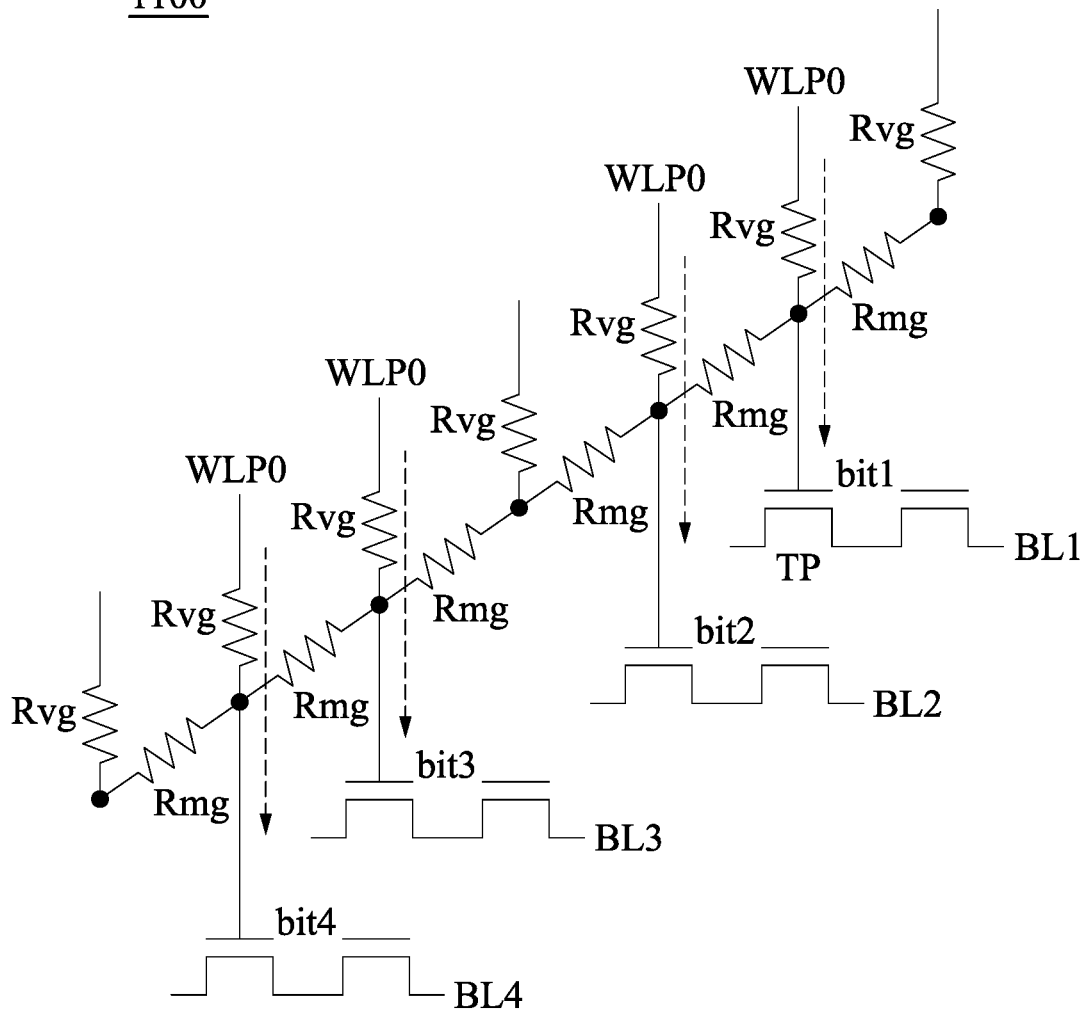
FIG. 11 is an equivalent circuit of part of the anti-fuse memory cell array in FIG. 3, in accordance with some embodiments of the present disclosure.

FIG. 11 is an equivalent circuit 1100 of part of the anti-fuse memory cell array 300 in FIG. 3, in accordance with some embodiments of the present disclosure. As shown in FIG. 11, the equivalent circuit 1100 corresponds to the anti-fuse memory cells bit1-bit4 of FIG. 3 and will be discussed in more detail below.

For illustration in FIG. 11, the equivalent circuit 1100 includes resistors Rvg, resistors Rmg, and the anti-fuse memory cells bit1-bit4. Each one of the resistors Rvg indicates the resistance between the program word line WLP0 and the gate terminal of the corresponding transistor TP of one of the anti-fuse memory cells bit1-bit4, as discussed above with respect to FIG. 2, and/or indicates the resistance contributed by gate vias including, for example, the gate via Vg1 of FIG. 5, in some embodiments. Each one of the resistors Rmg indicates the resistance of the gate structure corresponding to the gate terminal of the corresponding transistor TP of one of the anti-fuse memory cells bit1-bit4, as discussed above with respect to FIG. 2, and/or indicates the resistance contributed by gate structures including, for example, the gate G1 of FIG. 7, in some embodiments. Each one of the anti-fuse memory cells bit1-bit4 is connected to the program word line WLP0 (also as shown in FIG. 3) via one corresponding resistor Rvg. With the gate vias disposed directly above the active areas, as illustrated in the above layout structures, the current flows from the program word line WLP0 directly to the anti-fuse memory cells bit1-bit4 and does not have to experience the resistors Rmg, as shown in FIG. 11.

Figure 12A:
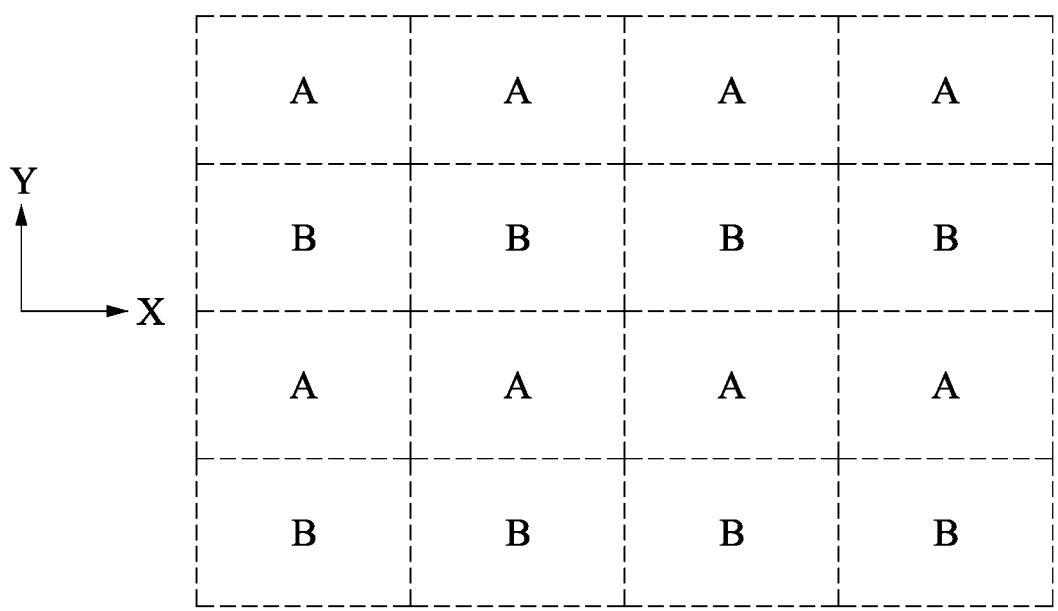
FIG. 12A is a layout structure including the units shown in FIG. 10, in accordance with some embodiments of the present disclosure.
Figure 12B:
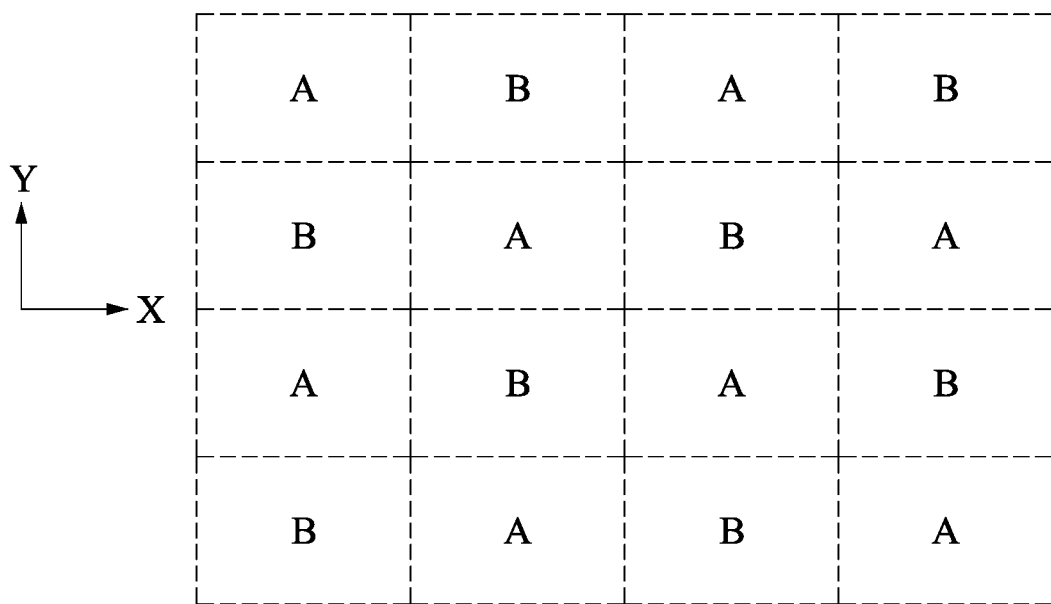
FIG. 12B is a layout structure including the units shown in FIG. 10, in accordance with some other embodiments of the present disclosure.

Reference is made to FIGS. 12A-12B. FIG. 12A is a layout structure 1200A including the units shown in FIG. 10, in accordance with some embodiments of the present disclosure. For simplicity of illustration, in FIG. 12A (and FIG. 12B), the reference number "A" indicates the unit UA of FIG. 10, and the reference number "B" indicates the unit UB of FIG. 10. The layout structure 1200A is configured to have a sequence of A units and/or B units from left to right or from top to bottom, in some embodiments. For illustration of FIG. 12A, from the left to right in the X direction, the units are arranged in a sequence of "AAAA" or "BBBB". From the top to bottom in the Y direction, the units are arranged in a sequence of "ABAB". The layout structure 1200A includes an array of 4 by 4 units as shown in FIG. 12A. The above number of the units of the layout structure 1200A is given for illustrative purposes. Various numbers of the units of the layout structure 1200A are within the contemplated scope of the present disclosure.

FIG. 12B is a layout structure 1200B including the units shown in FIG. 10, in accordance with some other embodiments of the present disclosure. Compared to the embodiments of FIG. 12A, in FIG. 12B, from the left to right in the X direction, the units are arranged in a sequence of "ABAB" or "BABA". From the top to bottom in the Y direction, the units are arranged in a sequence of "ABAB" or "BABA". The above number of the units of the layout structure 1200B is given for illustrative purposes. Various numbers of the units of the layout structure 1200B are within the contemplated scope of the present disclosure.

In some embodiments, in the layout structures 1200A and 1200B as discussed above, each A unit (or each B unit) abuts the units surrounding the A unit (or the B unit) and includes structures connected to the surrounding units as discussed with respect to FIG. 10.

Figure 13:
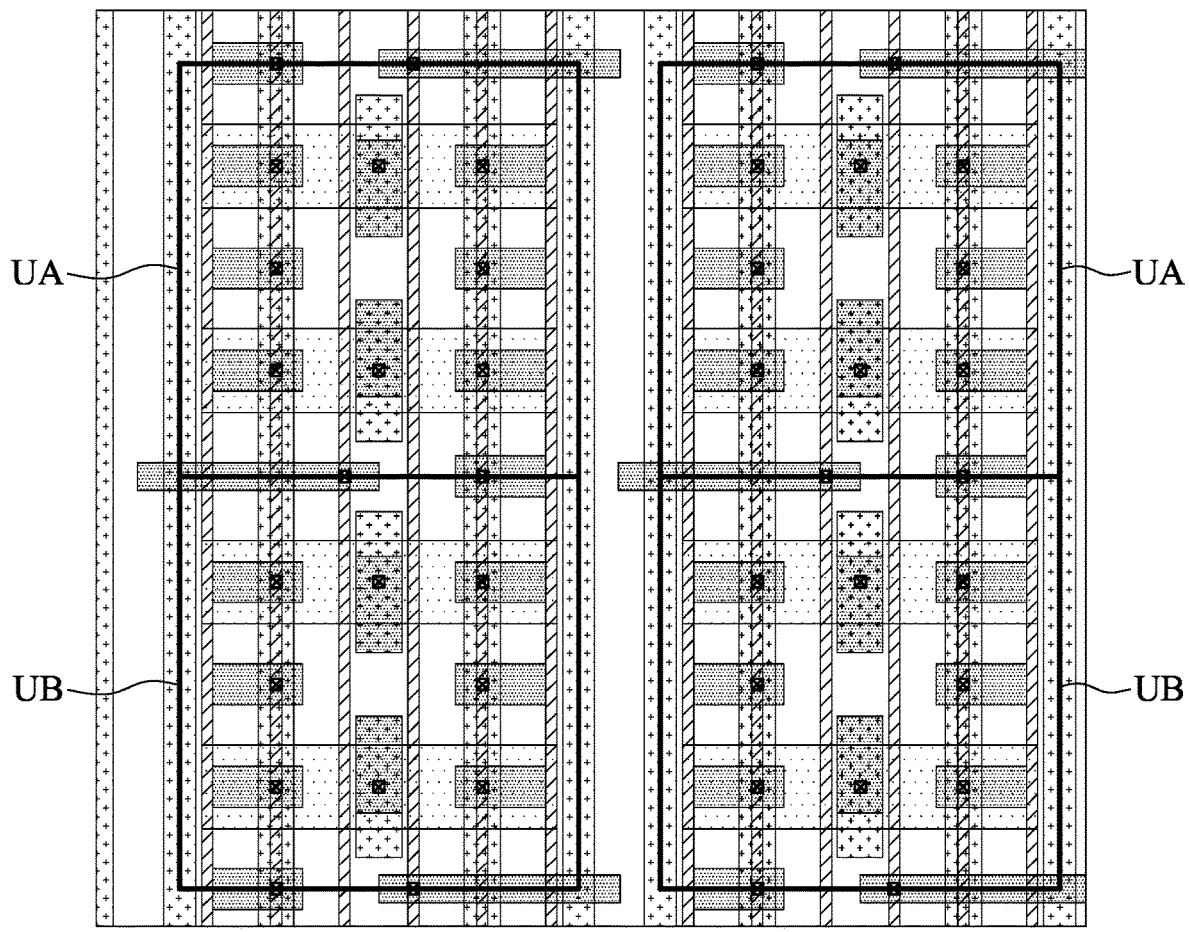
FIG. 13 is a layout structure including the layout structure of FIG. 10, in accordance with some embodiments of the present disclosure.

FIG. 13 is a layout structure 1300 including the layout structure 1000 of FIG. 10, in accordance with some embodiments of the present disclosure. For illustration in FIG. 13, the layout structure 1300 includes two units UA and two units UB, in which the left-side units UA and UB together correspond to the layout structure 1000 of FIG. 10 and thus they are not further detailed herein. The right-side units UA and UB also together correspond to the layout structure 1000 of FIG. 10, and thus they are not further detailed herein as well. In some embodiments, the left-side units UA and UB do not abut the right-side units UA and UB, as shown in FIG. 13. However, the configuration of the layout structure 1300 in FIG. 13 is given for illustrative purposes. Various configuration of the layout structure 1300 are within the contemplated scope of the present disclosure. For example, in various embodiments, with reference to FIG. 12A, the layout structure 1300 corresponds to an array of 2 by 2 units (i.e., ABAB) that abut each other, for example in the left-top corner, of the layout structure 1200A.

Figure 14:
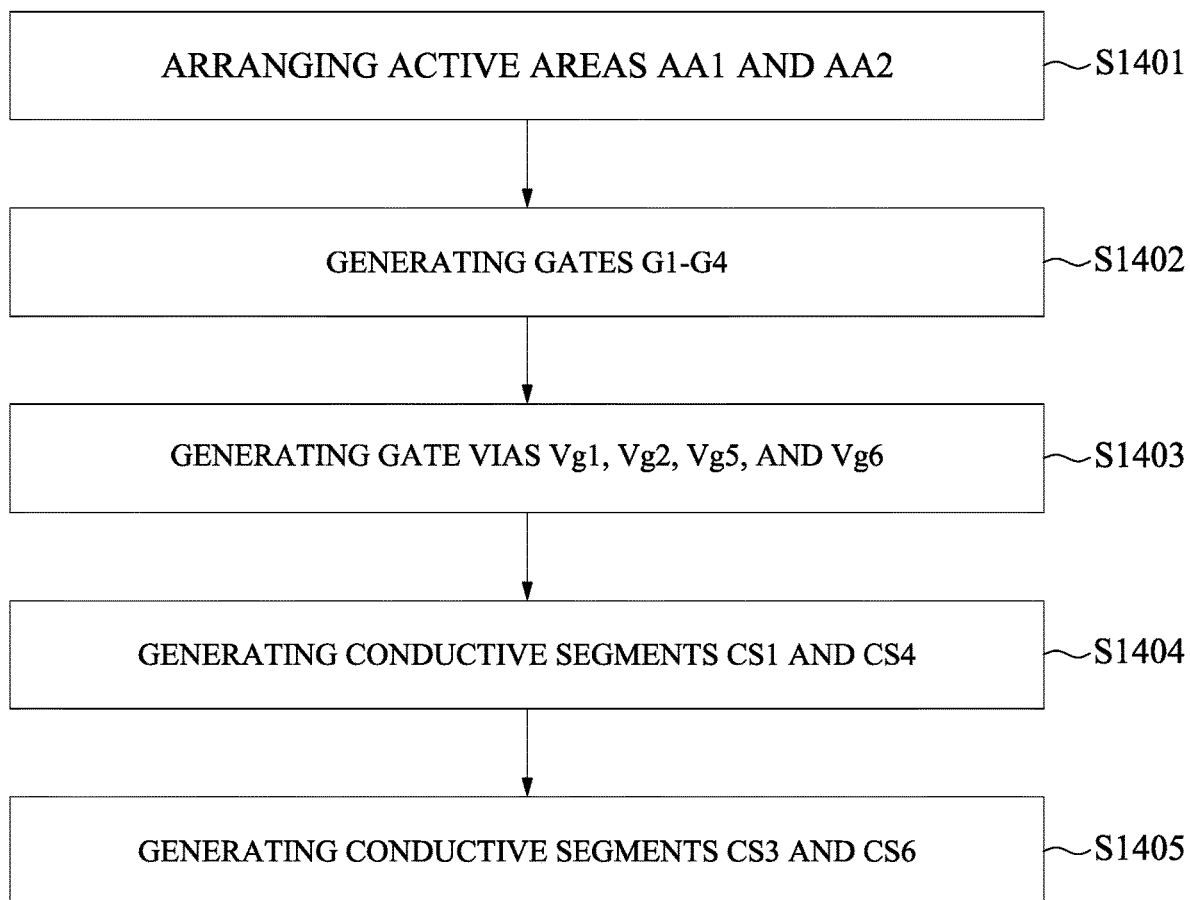
FIG. 14 is a flow chart of a method for generating an anti-fuse memory cell array, in accordance with some embodiments of the present disclosure.

FIG. 14 is a flow chart of a method 1400 for generating an anti-fuse memory cell array, in accordance with some embodiments of the present disclosure. For ease of understanding, the method 1400 is described with reference to FIGS. 1-13. However, the method 1400 is not limited to being applied to generate the above layout structures. The method 1400 is able to be applied to generate any suitable layout structure. For illustration in FIG. 14, the method 1400 includes operations S1401, S1402, S1403, S1404, and S1405, which will be discussed in detail below.

In operation S1401, the active areas AA1 and AA2 are arranged to be separate from each other and extend in the X direction, for example as shown in FIG. 7.

In operation S1402, with reference to FIG. 7, the gates G1-G4 are generated to extend in the Y direction and cross over the active areas AA1 and AA2. As discussed above, the gates G1 and G4 correspond to the gate terminals of transistors TP, and the gates G2 and G3 correspond to the gate terminals of transistors TR.

In operation S1403, with reference to FIG. 7, the gate vias Vg1-Vg2 are generated on the gate G1, and the gate vias Vg5-Vg6 are generated on the gate G4. The gate vias Vg1 and Vg5 are disposed directly above the active area AA1, and the gate vias Vg2 and Vg6 are disposed directly above the active area AA2.

In operation S1404, with reference to FIG. 7, the conductive segments CS1 and CS4 are generated to be disposed directly above the active areas AA1 and AA2, respectively, and the conductive segments CS1 and CS4 couple the gate G1 through the gate vias Vg1-Vg2 to the program word line WLP0 for receiving the programming voltage Vp.

In operation S1405, with reference to FIG. 7, the conductive segments CS3 and CS6 are generated to be disposed directly above the active areas AA1 and AA2, respectively, and the conductive segments CS3 and CS6 couple the gate G4 through the gate vias Vg5-Vg6 to the program word line WLP1 for receiving another programming voltage Vp'. In some embodiments, the programming voltage Vp is different form the programming voltage Vp'. In some other embodiments, the programming voltage Vp is the same as the programming voltage Vp'.

In some embodiments, with reference to FIG. 7, the method 1400 further includes the following operations of: generating the gate via Vgs1 on the gate G2, between the active areas AA1 and AA2, to couple the gate G2 to the read word line WLR0 for receiving the reading voltage Vdd; and generating the gate via Vgs2 on the gate G3, between the active areas AA1 and AA2, to couple the gate G3 to the read word line WLR1 for receiving the reading voltage Vdd'. In some embodiments, the reading voltage Vdd is different form the reading voltage Vdd'. In some other embodiments, the reading voltage Vdd is the same as the reading voltage Vdd'.

In some embodiments, with reference to FIG. 7, the method 1400 further includes the following operations of: generating the gate vias Vgs1, Vgs3 each disposed between the active areas AA1 and AA2, on the gate G1, to couple the gate G1 to the program word line WLP0 for receiving the programming voltage Vp; and generating the gate via Vgs2 disposed between the active areas AA1 and AA2, on the gate G4, to couple the gate G4 to the program word line WLP1 for receiving the programming voltage Vp'.

In some embodiments, with reference to FIG. 7, the method 1400 further includes the following operations of: generating conductive segments CS8 and CS10 each disposed between the active areas AA1 and AA2 to couple the gate G1 to the program word line WLP0 for receiving the programming voltage Vp; and generating the conductive segment CS9 disposed between the active areas AA1 and AA2 to couple the gate G4 to the program word line WLP1 for receiving the programming voltage Vp'.

In some embodiments, with reference to FIG. 7, the method 1400 further includes the operation of generating the conductive segments CS2 and CS5 that are separate from each other and disposed directly above the active areas AA1 and AA2, respectively. The conductive segments CS2 and CS5 are arranged along the Y direction and are configured to receive data signals different from each other.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 15:
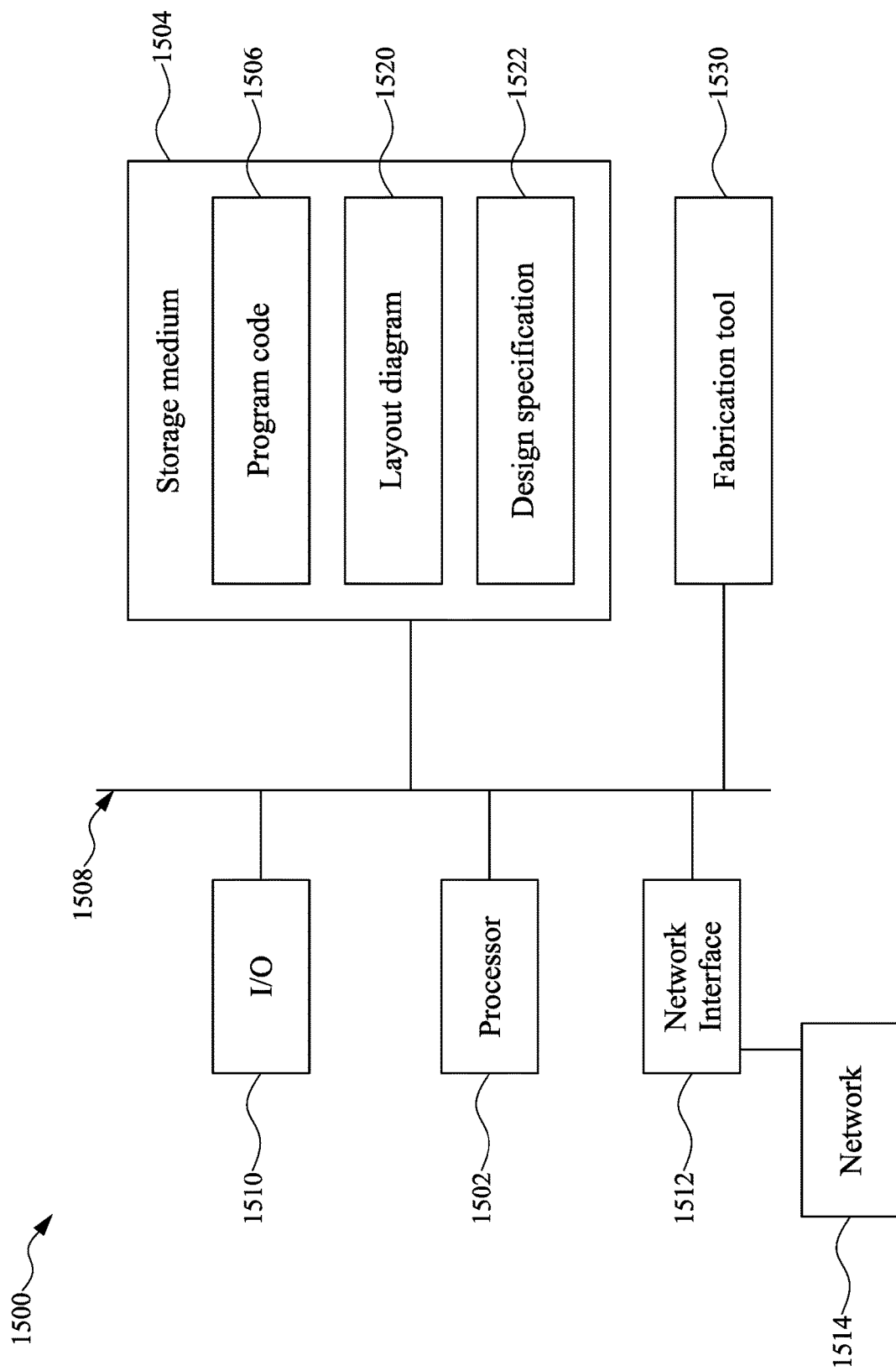
FIG. 15 is block diagram of integrated circuit (IC) device design system, in accordance with some embodiments of the present disclosure.

Reference is made to FIG. 15. FIG. 15 is a block diagram of an integrated circuit (IC) device design system 1500, in accordance with some embodiments. One or more operations of the method 1400, as discussed above with respect to FIG. 14, are implementable using the IC device design system 1500, in accordance with some embodiments.

In some embodiments, the IC device design system 1500 is a computing device including a hardware processor 1502 and a non-transitory computer-readable storage medium (also referred to as storage medium) 1504. Non-transitory computer-readable storage medium 1504, amongst other things, is encoded with, i.e., stores, computer program code 1506, i.e., a set of executable instructions. Execution of computer program code 1506 by hardware processor 1502 represents (at least in part) an IC device design system which implements a portion or all of, e.g., the method 1400 discussed above with respect to FIG. 14 (hereinafter, the noted processes and/or methods).

Processor 1502 is electrically coupled to non-transitory computer-readable storage medium 1504 via a bus 1508. Processor 1502 is also electrically coupled to an I/O interface 1510 and a fabrication tool 1530 by bus 1508. A network interface 1512 is also electrically connected to processor 1502 via bus 1508. Network interface 1512 is connected to a network 1514, so that processor 1502 and non-transitory, computer-readable storage medium 1504 are capable of being connected to external elements via network 1514. Processor 1502 is configured to execute computer program code 1506 encoded in non-transitory computer-readable storage medium 1504 in order to cause IC device design system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, non-transitory computer-readable storage medium 1504 is an electronic, magnetic, optical, electromagnetic, infrared, and/or a semiconductor system (or apparatus or device). For example, non-transitory computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 1504 includes a compact disk-read only memory (CD-ROM), a compact disk-read/write (CD-R/W), and/or a digital video disc (DVD).

In one or more embodiments, non-transitory computer-readable storage medium 1504 stores computer program code 1506 configured to cause IC device design system 1500 to be usable for performing a portion or all of the noted processes and/or method 1400. In one or more embodiments, non-transitory computer-readable storage medium 1504 also stores information which facilitates performing a portion or all of the noted processes and/or methods. In various embodiments, non-transitory computer-readable storage medium 1504 stores one or a combination of at least one IC layout diagram 1520 or at least one design specification 1522, each of which corresponds to the layout structures as discussed above with respect to the method 1400 and FIGS. 1-13, or at least one layout design applicable to manufacture the corresponding layout structure 400, 600, 700, 1000, 1200A, 1200B, or 1300, as discussed above.

In some embodiments, non-transitory computer-readable storage medium 1504 stores instructions (e.g., computer program code 1506) for interfacing with manufacturing machines. The instructions (e.g., computer program code 1506) enable processor 1502 to generate manufacturing instructions readable by the manufacturing machines to effectively implement method 1400 during a manufacturing process.

IC device design system 1500 includes I/O interface 1510. I/O interface 1510 is coupled to external circuitry. In various embodiments, I/O interface 1510 includes one or a combination of a keyboard, keypad, mouse, trackball, trackpad, display, touchscreen, and/or cursor direction keys for communicating information and commands to and/or from processor 1502.

IC device design system 1500 also includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods is implemented in two or more systems 1500.

The IC device design system 1500 also includes the fabrication tool 1530 coupled to the processor 1502. The fabrication tool 1530 is configured to fabricate integrated circuits, including, for example, the layout structure 400 illustrated in FIG. 4, the layout structure 600 illustrated in FIG. 6, the layout structure 700 illustrated in FIG. 7, the layout structure 1000 illustrated in FIG. 10, and the layout structure 1300 illustrated in FIG. 13, based on the design files processed by the processor 1502 and/or the IC layout designs as discussed above.

IC device design system 1500 is configured to receive information through I/O interface 1510. The information received through I/O interface 1510 includes one or a combination of at least one design rule instructions, at least one set of criteria, at least one design rule, at least one DRM, and/or other parameters for processing by processor 1502. The information is transferred to processor 1502 via bus 1508. IC device design system 1500 is configured to transmit and/or receive information related to a user interface through I/O interface 1510.

In some embodiments, a portion or all of the noted processes and/or method 1400 is implemented as a stand-alone software application for execution by a processor. In some embodiments, a portion or all of the noted processes and/or method 1400 is implemented as a software application that is a part of an additional software application. In some embodiments, a portion or all of the noted processes and/or method 1400 is implemented as a plug-in to a software application. In some embodiments, at least one of the noted processes and/or method 1400 is implemented as a software application that is a portion of an EDA tool. In some embodiments, an IC layout diagram or layout design is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 1400, as discussed above with respect to FIGS. 1-13, IC device design system 1500 enables the benefits discussed above with respect to method 1400.

Figure 16:
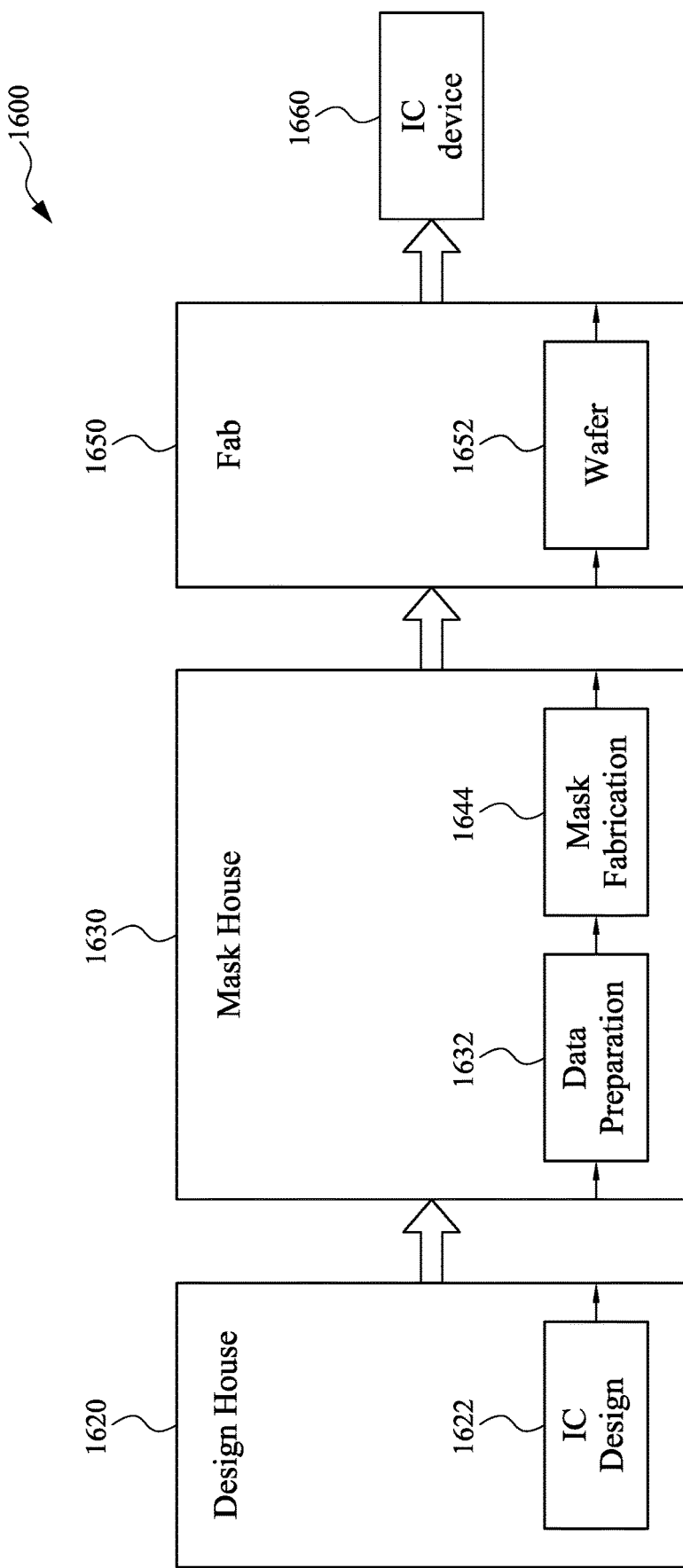
FIG. 16 is block diagram of IC manufacturing system, and an IC manufacturing flow associated therewith, in accordance with some embodiments of the present disclosure.

Reference is made to FIG. 16. FIG. 16 is a block diagram of IC manufacturing system 1600, and an IC manufacturing flow associated therewith, in accordance with some embodiments. In some embodiments, based on a layout diagram/design, at least one of (A) one or more semiconductor masks or (B) at least one component in a layer of a semiconductor integrated circuit is fabricated using the manufacturing system 1600.

In FIG. 16, IC manufacturing system 1600 includes entities, such as a design house 1620, a mask house 1630, and an IC manufacturer/fabricator ("fab") 1650, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1620, mask house 1630, and IC fab 1650 is owned by a single larger company. In some embodiments, two or more of design house 1620, mask house 1630, and IC fab 1650 coexist in a common facility and use common resources.

Design house (or design team) 1620 generates an IC design layout diagram (also noted as IC design in FIG. 16) 1622 based on the method 1400, as discussed above with respect to FIGS. 1-13. IC design layout diagram 1622 includes various geometrical patterns that correspond to patterns of metal, oxide, or semiconductor layers that make up the various components of IC device 1660 to be fabricated. The various patterns are combined to form various IC features. For example, a portion of IC design layout diagram 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure including method 1400, discussed above with respect to FIGS. 1-13, to form IC design layout diagram 1622. The design procedure includes one or more of logic design, physical design or place and route. IC design layout diagram 1622 is presented in one or more data files having information of the geometrical patterns. For example, IC design layout diagram 1622 can be expressed in a GDSII file format or DFII file format.

Mask house 1630 includes mask data preparation (also noted as data preparation in FIG. 16) 1632 and mask fabrication 1644. Mask house 1630 uses IC design layout diagram 1622 to manufacture one or more masks to be used for fabricating the various layers of IC device 1660 according to IC design layout diagram 1622. Mask house 1630 performs mask data preparation 1632, where IC design layout 1622 is translated into a representative data file ("RDF"). Mask data preparation 1632 provides the RDF to mask fabrication 1644. Mask fabrication 1644 includes a mask writer. A mask writer converts the RDF to an image on a substrate, such as a mask (reticle) or a semiconductor wafer 1652. The design layout diagram 1622 is manipulated by mask data preparation 1632 to comply with particular characteristics of the mask writer and/or requirements of IC fab 1650. In FIG. 16, mask data preparation 1632 and mask fabrication 1644 are illustrated as separate elements. In some embodiments, mask data preparation 1632 and mask fabrication 1644 can be collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout diagram 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1632 includes a mask rule checker (MRC) that checks the IC design layout diagram 1622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1622 to compensate for limitations during mask fabrication 1644, which may undo part of the modifications performed by OPC in order to meet mask creation rules.

In some embodiments, mask data preparation 1632 includes lithography process checking (LPC) that simulates processing that will be implemented by IC fab 1650 to fabricate IC device 1660. LPC simulates this processing based on IC design layout diagram 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1622.

It should be understood that the above description of mask data preparation 1632 has been simplified for the purposes of clarity. In some embodiments, mask data preparation 1632 includes additional features such as a logic operation (LOP) to modify the IC design layout diagram 1622 according to manufacturing rules. Additionally, the processes applied to IC design layout diagram 1622 during mask data preparation 1632 may be executed in a variety of different orders.

After mask data preparation 1632 and during mask fabrication 1644, a mask or a group of masks are fabricated based on the modified IC design layout diagram 1622. In some embodiments, mask fabrication 1644 includes performing one or more lithographic exposures based on IC design layout diagram 1622. In some embodiments, an electron-beam (e-beam) or a mechanism of multiple e-beams is used to form a pattern on a mask (photomask or reticle) based on the modified IC design layout diagram 1622. Mask can be formed in various technologies. In some embodiments, mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask includes a transparent substrate (e.g., fused quartz) and an opaque material (e.g., chromium) coated in the opaque regions of the binary mask. In another example, mask is formed using a phase shift technology. In a phase shift mask (PSM) version of mask, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1644 is used in a variety of processes. For example, such a mask(s) is used in an ion implantation process to form various doped regions in semiconductor wafer 1652, in an etching process to form various etching regions in semiconductor wafer 1652, and/or in other suitable processes.

IC fab 1650 includes wafer fabrication. IC fab 1650 is an IC fabrication business that includes one or more manufacturing facilities for the fabrication of a variety of different IC products. In some embodiments, IC Fab 1650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1650 uses mask(s) fabricated by mask house 1630 to fabricate IC device 1660. Thus, IC fab 1650 at least indirectly uses IC design layout diagram 1622 to fabricate IC device 1660. In some embodiments, semiconductor wafer 1652 is fabricated by IC fab 1650 using mask(s) to form IC device 1660. In some embodiments, the IC fabrication includes performing one or more lithographic exposures based at least indirectly on IC design layout diagram 1622. Semiconductor wafer 1652 includes a silicon substrate or other proper substrate having material layers formed thereon. Semiconductor wafer 1652 further includes one or more of various doped regions, dielectric features, multi-level interconnects, and the like (formed at subsequent manufacturing steps).

In this document, the term "coupled" may also be termed as "electrically coupled," and the term "connected" may be termed as "electrically connected". "Coupled" and "connected" may also be used to indicate that two or more elements cooperate or interact with each other.

Also disclosed is a method that includes: coupling a first gate to a first word line through a first gate via, wherein the first gate extends along a first direction; coupling the first gate to a second word line through a second gate via, wherein each of the first gate, a second gate, the first gate via and the second gate via is disposed on a first active area which extends along the second direction, wherein the second gate extends along the first direction and is separated from the first gate along a second direction; coupling the first active area to a first bit line through a first conductive via; and aligning the first gate via, the second gate via and the a first conductive via with each other along the second direction.

Also disclosed is a method that includes: forming a first conductive segment crossing over a first gate and a second gate; forming a first via above the first conductive segment, wherein the first gate is coupled through the first via to a first word line; and forming a second conductive segment crossing over the second gate; forming a second via above the second conductive segment. The second gate is coupled through the second via to a second word line directly above the second gate, the second gate is separated from the first gate along a first direction, and the first gate, the second gate and the first word line are arranged in order along the first direction.

Also disclosed is a method that includes: forming a first gate extending along a first direction and crossing over a first active area and a second active area; forming a first gate via between a first boundary of the first active area and a second boundary of the first active area; forming a second gate via between a third boundary of the second active area and a fourth boundary of the second active area; and forming a third gate via between the third boundary and the second boundary. The first gate is coupled through each of the third gate via, the second gate via and the first gate via to a first word line, and the fourth boundary, the third boundary, the second boundary and the first boundary are arranged in order along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    coupling a first gate to a first word line through a first gate via, wherein the first gate extends along a first direction;
    coupling a second gate to a second word line through a second gate via, wherein each of the first gate via and the second gate via and each of the corresponding parts of the first and second gates is disposed on a first active area which extends along a second direction, wherein the second gate extends along the first direction and is separated from the first gate along the second direction;
    coupling the first active area to a first bit line through a first conductive via; and
    aligning the first gate via, the second gate via and the first conductive via with each other along the second direction.

2. The method of claim 1, further comprising:
    coupling a first conductive segment between the first gate via and the first word line; and
    coupling a second conductive segment between the first conductive via and the first bit line,
    wherein each of the first conductive segment and the second conductive segment is overlapped with the first active area in a layout view.

3. The method of claim 2, further comprising:
    coupling a third conductive segment between the second gate via and the second word line,
    wherein the third conductive segment is overlapped with the first active area in the layout view.

4. The method of claim 1, further comprising:
    coupling the first gate to the first word line through a third gate via which is disposed directly above a second active area;
    coupling the second active area to a second bit line through a second conductive via; and
    aligning the third gate via and the second conductive via with each other along the second direction.

5. The method of claim 4, further comprising:
    coupling the first gate to the first word line through a fourth gate via which is disposed between the third gate via and the first gate via; and
    coupling the second gate to the second word line through a fifth gate via which is aligned with the fourth gate via along the second direction.

6. The method of claim 4, further comprising:
    coupling the second gate to the second word line through a fourth gate via which is disposed directly above the second active area; and
    aligning the fourth gate via and the second conductive via with each other along the second direction.

7. The method of claim 1, further comprising:
    coupling a third gate to a third word line; and
    arranging the first word line, the third gate, the second word line and the third word line in order along the second direction.

8. The method of claim 7, further comprising:
    coupling the first gate to the first word line through a third gate via; and
    aligning the third gate via, a fourth gate via and a first via with each other along the second direction,
    wherein coupling the third gate to the third word line comprises coupling the third gate to the third word line though the fourth gate via and the first via.

9. A method, comprising:
    forming a first conductive segment crossing over a first gate and a second gate;
    forming a first via above the first conductive segment, wherein the first gate is coupled through the first via to a first word line;
    forming a second conductive segment crossing over the second gate; and
    forming a second via above the second conductive segment;
    wherein the second gate is coupled through the second via to a second word line directly above the second gate,
    the second gate is separated from the first gate along a first direction, and
    the first gate, the second gate and the first word line are arranged in order along the first direction.

10. The method of claim 9, further comprising:
    forming a third conductive segment crossing over the first gate and the second gate,
    wherein the first gate is coupled through the third conductive segment to the first word line, and the second conductive segment is disposed between the third conductive segment and the first conductive segment.

11. The method of claim 9, further comprising:
forming a third conductive segment crossing over the second gate and overlapped with a first active area; and
forming a fourth conductive segment crossing over the second gate and disposed between the third conductive segment and the second conductive segment,
wherein the second conductive segment is overlapped with a second active area which is separated from the first active area, and
the second gate is coupled to the second word line through each of the third conductive segment and the fourth conductive segment.

12. The method of claim 9, further comprising:
forming a third conductive segment crossing over a third gate and aligned with the first conductive segment along the first direction; and
forming a fourth conductive segment crossing over the third gate and aligned with the second conductive segment along the first direction,
wherein the third gate is coupled to a third word line through each of the third conductive segment and the fourth conductive segment.

13. The method of claim 12, further comprising:
forming a fifth conductive segment crossing over the third gate and a fourth gate and coupling the fourth gate to a fourth word line,
wherein the fourth word line, the third word line, the second word line and the first word line are arranged in order along the first direction.

14. The method of claim 13, further comprising:
forming a sixth conductive segment crossing over the second gate and aligned with the fifth conductive segment,
wherein the second gate is further coupled through the sixth conductive segment to the second word line.

15. A method, comprising:
forming a first gate extending along a first direction and crossing over a first active area and a second active area;
forming a first gate via over a first region disposed between a first boundary of the first active area and a second boundary of the first active area;
forming a second gate via over a second region disposed between a third boundary of the second active area and a fourth boundary of the second active area; and
forming a third gate via over a third region disposed between the third boundary and the second boundary;
wherein the first gate is coupled through each of the third gate via, the second gate via and the first gate via to a first word line, and the fourth boundary, the third boundary, the second boundary and the first boundary are arranged in order along the first direction.

16. The method of claim 15, further comprising:
forming a first conductive via between the first boundary and the second boundary,
wherein the first active area is coupled to a first bit line through the first conductive via.

17. The method of claim 16, further comprising:
forming a second gate separated from the first gate and crossing over the first active area and the second active area;
forming a third gate via between the first boundary and the second boundary;
forming a third gate between the third gate via and the first conductive via; and
forming a first conductive segment crossing over the third gate and the second gate;
wherein the second gate is coupled through third gate via to a second word line,
the third gate is coupled through the first conductive segment to a third word line, and
the second word line is disposed between the first word line and the third word line.

18. The method of claim 16, further comprising:
forming a second conductive via between the third boundary and the fourth boundary,
wherein the second active area is coupled to a second bit line through the second conductive via.

19. The method of claim 15, further comprising:
forming a second gate separated from the first gate and crossing over the first active area and the second active area;
forming a fourth gate via between the first boundary and the second boundary;
forming a fifth gate via between the third boundary and the fourth boundary; and
forming a sixth gate via between the third boundary and the second boundary,
wherein the second gate is coupled through each of the fourth gate via, the fifth gate via and the sixth gate via to a second word line.

20. The method of claim 19, further comprising:
forming a first conductive via between the first boundary and the second boundary;
forming a second conductive via between the third boundary and the fourth boundary;
forming a first bit line crossing over the first active area and coupled to the first conductive via; and
forming a second bit line crossing over the second active area and coupled to the second conductive via.

* * * * *